United States Patent
Koezuka et al.

(10) Patent No.: US 10,290,656 B2
(45) Date of Patent: May 14, 2019

(54) SEMICONDUCTOR DEVICE WITH OXIDE SEMICONDUCTOR FILM ELECTRICAL CHARACTERISTIC CHANGE OF WHICH IS INHIBITED

(71) Applicant: Semiconductor Energy Laboratory Co., Ltd., Kanagawa-ken (JP)

(72) Inventors: Junichi Koezuka, Tochigi (JP); Masami Jintyou, Tochigi (JP); Daisuke Kurosaki, Tochigi (JP); Yukinori Shima, Gunma (JP); Toshimitsu Obonai, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/721,362

(22) Filed: May 26, 2015

(65) Prior Publication Data
US 2015/0348998 A1 Dec. 3, 2015

(30) Foreign Application Priority Data

May 30, 2014 (JP) ................................. 2014-112466

(51) Int. Cl.
*H01L 29/66* (2006.01)
*H01L 29/786* (2006.01)
(Continued)

(52) U.S. Cl.
CPC ...... *H01L 27/1225* (2013.01); *H01L 29/7869* (2013.01); *H01L 29/78648* (2013.01); *H01L 27/1255* (2013.01)

(58) Field of Classification Search
CPC .......... H01L 29/7869; H01L 29/78693; H01L 29/78606; H01L 29/4908; H01L 29/518;
(Continued)

(56) References Cited

U.S. PATENT DOCUMENTS 7,601,984 B2 10/2009 Sano et al.
8,551,824 B2 10/2013 Yamazaki et al.
(Continued)

FOREIGN PATENT DOCUMENTS

JP   2006-165529 A   6/2006
JP   2010-165999 A   7/2010
(Continued)

OTHER PUBLICATIONS

Ryu et al., O-vacancy as the origin of negative bias illumination stress instability in amorphous In—Ga—Zn—O thin film transistors, 2010, Appl. Phys. Lett, 97, pp. 022108-(1-3).*
(Continued)

*Primary Examiner* — Natalia A Gondarenko
(74) *Attorney, Agent, or Firm* — Husch Blackwell LLP

(57) ABSTRACT

Provided is a transistor which includes an oxide semiconductor film in a channel region. A change from a shift value before light irradiation to a shift value under light irradiation is greater than or equal to −1 V and less than or equal to 0.5 V, where the shift value is a gate voltage at a point of intersection of an axis of $1\times10^{-12}$ A and a steepest tangent line of the logarithm of a drain current in drain current-gate voltage characteristics of the transistor, and where the light irradiation is performed on the oxide semiconductor film with light having an energy greater than or equal to a band gap of the oxide semiconductor film.

15 Claims, 26 Drawing Sheets

(51) Int. Cl.
*H01L 27/12* (2006.01)
*H01L 21/04* (2006.01)
*H01L 21/26* (2006.01)

(58) Field of Classification Search
CPC . H01L 29/786; H01L 29/517; H01L 29/0847;
H01L 27/1214; H01L 27/1248; H01L
27/3262; H01L 27/1288; H01L 27/3258;
H01L 27/471; H01L 21/02164; H01L
21/02362; H01L 21/02488; H01L
21/02554; H01L 21/76846; H01L
27/127–27/1285; H01L 27/3276; H01L
29/42384–29/42392; H01L
29/78681–29/78696; H01L 2924/00;
H01L 27/1225; H01L 27/12–27/1251;
H01L 27/1259–27/1296; H01L 21/471;
H01L 23/53295; H01L 2021/775; H01L
51/4233; G02F 1/136286; G02F
1/136–1/1368
USPC ............... 257/43, 57, 59, E29.273, E29.068,
257/E21.04; 438/104, 161
See application file for complete search history.

(56) References Cited

U.S. PATENT DOCUMENTS

| | | | |
|---|---|---|---|
| 9,082,858 B2 | 7/2015 | Tsubuku et al. | |
| 9,224,339 B2 | 12/2015 | Yamazaki et al. | |
| 9,508,856 B2 | 11/2016 | Tao et al. | |
| 9,564,534 B2 | 2/2017 | Tsubuku et al. | |
| 2009/0179199 A1 | 7/2009 | Sano et al. | |
| 2010/0123130 A1* | 5/2010 | Akimoto | H01L 29/04 257/43 |
| 2010/0207118 A1* | 8/2010 | Sakata | H01L 29/78669 257/43 |
| 2011/0136301 A1* | 6/2011 | Yamazaki | H01L 21/28176 438/156 |
| 2011/0204368 A1* | 8/2011 | Tsubuku | H01L 27/1225 257/59 |
| 2011/0284844 A1 | 11/2011 | Endo et al. | |
| 2011/0284854 A1* | 11/2011 | Endo | H01L 29/4908 257/59 |
| 2012/0052602 A1* | 3/2012 | Hatano | H01L 27/1225 438/14 |
| 2012/0293204 A1* | 11/2012 | Nishijima | H03K 19/0944 326/70 |
| 2012/0315730 A1 | 12/2012 | Koezuka et al. | |
| 2013/0075721 A1* | 3/2013 | Yamazaki | H01L 27/12 257/43 |
| 2013/0082253 A1* | 4/2013 | Yamazaki | H01L 29/41733 257/43 |
| 2013/0137232 A1 | 5/2013 | Ito et al. | |
| 2013/0248858 A1* | 9/2013 | Morita | C23C 14/086 257/43 |
| 2013/0277672 A1 | 10/2013 | Sano et al. | |
| 2013/0341617 A1* | 12/2013 | Tao | H01L 29/7869 257/43 |
| 2014/0038351 A1 | 2/2014 | Yamazaki et al. | |
| 2014/0103338 A1 | 4/2014 | Yamazaki et al. | |
| 2014/0361290 A1 | 12/2014 | Yamazaki et al. | |
| 2014/0361292 A1 | 12/2014 | Yamazaki et al. | |
| 2015/0072472 A1 | 3/2015 | Yamazaki | |
| 2015/0179112 A1 | 6/2015 | Yamazaki et al. | |
| 2015/0249157 A1 | 9/2015 | Yamazaki et al. | |
| 2015/0249160 A1 | 9/2015 | Yamazaki et al. | |
| 2015/0270407 A1 | 9/2015 | Suzuki et al. | |
| 2015/0303309 A1 | 10/2015 | Koezuka et al. | |
| 2015/0355095 A1* | 12/2015 | Hayashi | G01N 21/6489 250/459.1 |
| 2018/0082645 A1 | 3/2018 | Yamazaki et al. | |

FOREIGN PATENT DOCUMENTS

| | | | | |
|---|---|---|---|---|
| JP | 2011-192977 A | | 9/2011 | |
| JP | 2011-199272 A | | 10/2011 | |
| JP | 2012-009836 A | | 1/2012 | |
| JP | 2012-032801 A | | 2/2012 | |
| JP | 2013055795 A | * | 3/2013 | |
| JP | 2013-239532 A | | 11/2013 | |
| JP | 2014-086445 A | | 5/2014 | |
| WO | WO 2011/102203 A1 | | 8/2011 | |
| WO | WO 2013/172238 A1 | | 11/2013 | |
| WO | WO 2014112153 A1 | * | 7/2014 | ......... G01N 21/6489 |

OTHER PUBLICATIONS

Cho, I-T. et al., "Full-Swing a-IGZO Inverter With a Depletion Load Using Negative Bias Instability Under Light Illumination," IEEE Electron Device Letters, Dec. 2012, vol. 33, No. 12, pp. 1726-1728.

* cited by examiner

100A

100A

140A

140A

160A

160A

100C

100C

100C

100D

100D

100D

SEMICONDUCTOR DEVICE WITH OXIDE SEMICONDUCTOR FILM ELECTRICAL CHARACTERISTIC CHANGE OF WHICH IS INHIBITED

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. One embodiment of the present invention relates to a semiconductor device, a display device, a light-emitting device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic appliances such as an integrated circuit (IC) and an image display device (display device). A semiconductor material typified by silicon is widely known as a material for a semiconductor thin film that can be used in a transistor. As another material, an oxide semiconductor has been attracting attention (e.g., Patent Document 1).

A semiconductor device including, as a base insulating layer of an oxide semiconductor layer where a channel is formed, an insulating layer that releases oxygen by heating to reduce oxygen vacancy in the oxide semiconductor layer is disclosed (e.g., Patent Document 2).

A method for manufacturing a semiconductor device in which an oxide semiconductor layer is highly purified in the following manner is disclosed: an oxide insulating layer is formed over the oxide semiconductor layer; oxygen is introduced (added) through the oxide insulating layer; heat treatment is performed; and impurities such as hydrogen, moisture, a compound having a hydroxyl group, or a hydride are removed from the oxide semiconductor layer by the introduction of oxygen and the heat treatment (e.g., Patent Document 3).

REFERENCE

Patent Document

[Patent Document 1] Japanese Published Patent Application No. 2006-165529
[Patent Document 2] Japanese Published Patent Application No. 2012-009836
[Patent Document 3] Japanese Published Patent Application No. 2011-199272

SUMMARY OF THE INVENTION

In the case where a transistor is fabricated using an oxide semiconductor film for a channel region, oxygen vacancy formed in the channel region of the oxide semiconductor film adversely affects the transistor characteristics; therefore, the oxygen vacancy causes a problem. For example, oxygen vacancy formed in the channel region of the oxide semiconductor film is bonded with hydrogen to serve as a carrier supply source. The carrier supply source generated in the channel region of the oxide semiconductor film causes a change in the electrical characteristics, typically, a shift in the threshold voltage, of the transistor including the oxide semiconductor film. Furthermore, there is a problem in that electrical characteristics vary among the transistors. Therefore, it is preferable that the amount of oxygen vacancy in the channel region of the oxide semiconductor film be as small as possible.

In view of the above problem, an object of one embodiment of the present invention is to inhibit a change in electrical characteristics and to improve reliability of a semiconductor device using a transistor including an oxide semiconductor. Another object of one embodiment of the present invention is to provide a semiconductor device with low power consumption. Another object of one embodiment of the present invention is to provide a display device having the semiconductor device.

Note that the description of the above objects does not disturb the existence of other objects. In one embodiment of the present invention, there is no need to achieve all the objects. Objects other than the above objects will be apparent from and can be derived from the description of the specification and the like.

One embodiment of the present invention is a semiconductor device including a transistor. The transistor includes an oxide semiconductor film in a channel region. A change from a shift value before light irradiation to a shift value under light irradiation is greater than or equal to −1 V and less than or equal to 0.5 V, where the shift value is a gate voltage at a point of intersection of an axis of $1\times10^{-12}$ A and a steepest tangent line of the logarithm of a drain current in drain current-gate voltage characteristics of the transistor, and where the light irradiation is performed on the oxide semiconductor film with light having an energy greater than or equal to a band gap of the oxide semiconductor film.

One embodiment of the present invention is a semiconductor device including a transistor. The transistor includes an oxide semiconductor film in a channel region. A change from a shift value before light irradiation to a shift value under light irradiation is greater than or equal to −1 V and less than or equal to 0.5 V, where the shift value is a gate voltage at a point of intersection of an axis of $1\times10^{-12}$ A and a steepest tangent line of the logarithm of a drain current in drain current-gate voltage characteristics of the transistor, and where the light irradiation is performed on the oxide semiconductor film with light having an energy greater than or equal to 2.8 eV and less than or equal to 3.0 eV.

In each of the above structures, the oxide semiconductor film preferably includes In, Zn, and M (M is Ti, Ga, Sn, Y, Zr, La, Ce, Nd, or Hf). In each of the above structures, the oxide semiconductor film preferably includes In, Zn, and Ga. In each of the above structures, it is preferable that the oxide semiconductor film include a crystal part and the crystal part have c-axis alignment. In each of the above structures, it is preferable that the oxide semiconductor film have a homologous structure and the content of In be larger than that of Ga. In each of the above structures, the oxide semiconductor film has a region whose thickness is greater than or equal to 5 nm and less than or equal to 50 nm.

In each of the above structures, the transistor preferably includes a first gate electrode; a first gate insulating film over the first gate electrode; the oxide semiconductor film over the first gate insulating film; a source electrode electrically connected to the oxide semiconductor film; a drain electrode electrically connected to the oxide semiconductor film; a second gate insulating film over the oxide semiconductor film, the source electrode, and the drain electrode; and a second gate electrode over the second gate insulating film.

Another embodiment of the present invention is a display device including the semiconductor device according to any one of the above structures, and a display element. Another embodiment of the present invention is a display module including the display device and a touch sensor. Another embodiment of the present invention is an electronic appliance including the semiconductor device according to any one of the above structures, the display device, or the display module; and an operation key or a battery.

According to one embodiment of the present invention, a change in electrical characteristics can be inhibited and reliability can be improved in a semiconductor device using a transistor including an oxide semiconductor. According to one embodiment of the present invention, a semiconductor device with low power consumption can be provided. According to one embodiment of the present invention, a display device having the semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1:
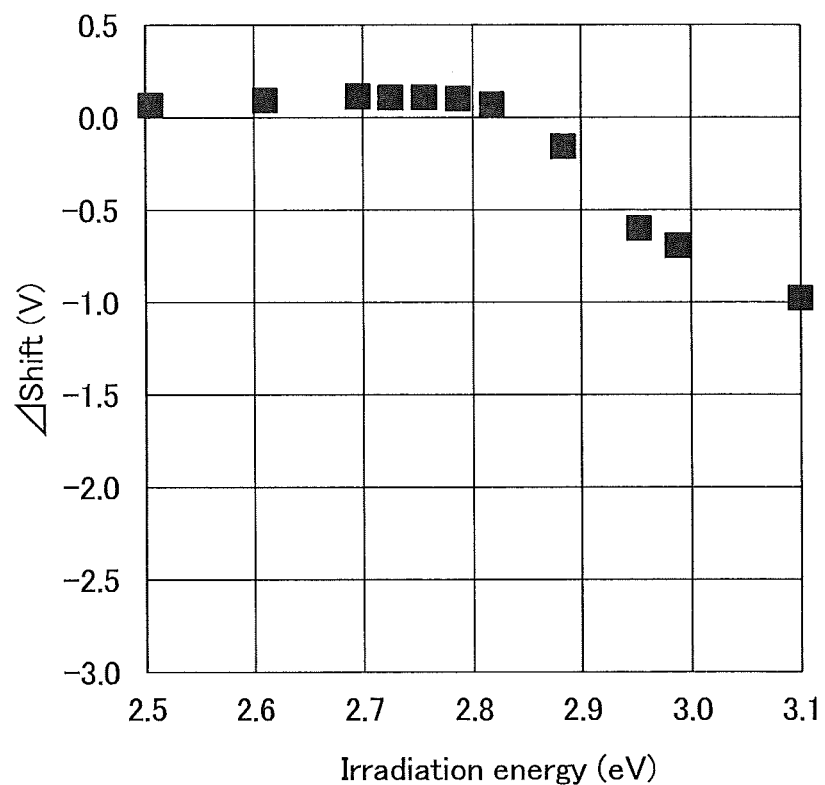
FIG. 1 shows a change in shift value of a transistor due to light irradiation.

Embodiments will be described below with reference to drawings. Note that the embodiments can be implemented with various modes. It will be readily appreciated by those skilled in the art that modes and details can be changed in various ways without departing from the spirit and scope of the present invention. Therefore, the present invention should not be interpreted as being limited to the following description of the embodiments.

In the drawings, the size, the layer thickness, and the region are exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

In this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, a "silicon oxynitride film" refers to a film that includes oxygen at a higher proportion than nitrogen, and a "silicon nitride oxide film" refers to a film that includes nitrogen at a higher proportion than oxygen.

In describing structures of the present invention with reference to the drawings in this specification and the like, common reference numerals are used for the same portions in different drawings.

In this specification and the like, a term "parallel" indicates that the angle formed between two straight lines is greater than or equal to −10° and less than or equal to 10°, and accordingly includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

In this specification and the like, the terms "film" and "layer" can be switched depending on the case or circumstances. For example, the term "conductive layer" can be used instead of the term "conductive film" in some cases. Similarly, the term "insulating film" can be used instead of the term "insulating layer" in some cases.

Embodiment 1

In this embodiment, a semiconductor device of one embodiment of the present invention and a manufacturing method thereof are described with reference to FIG. 1, FIGS. 2A to 2C, FIGS. 3A to 3C, FIGS. 4A to 4C, FIGS. 5A to 5F, FIGS. 6A to 6C, FIGS. 7A to 7C, FIGS. 8A to 8C, FIGS. 9A to 9H, FIGS. 10A to 10F, and FIGS. 11A to 11H.

Structure Example 1 of Semiconductor Device

Figure 2A:
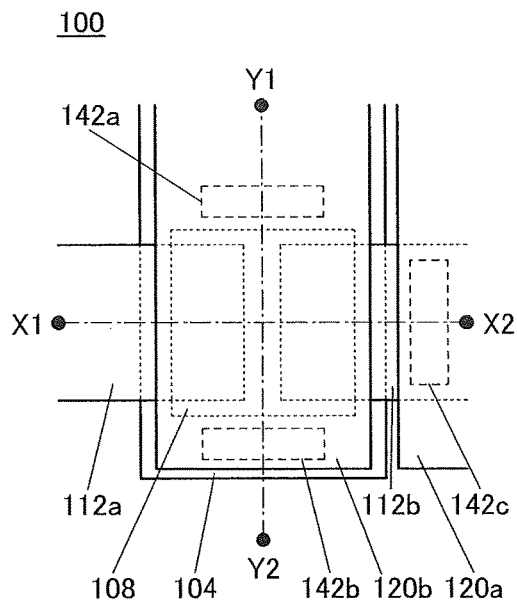
FIGS. 2A to 2C are a top view and cross-sectional views illustrating one embodiment of a semiconductor device.
Figure 2B:
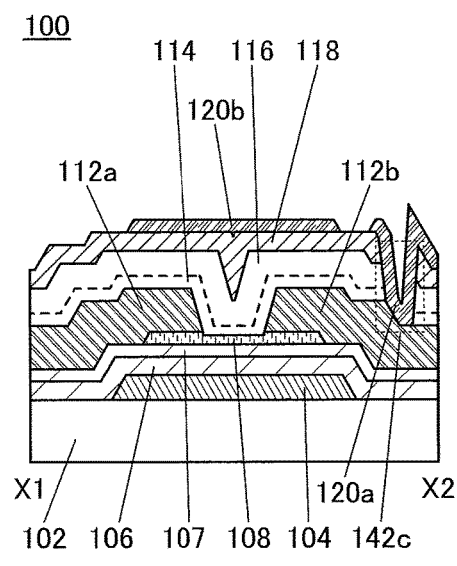
Figure 2C:
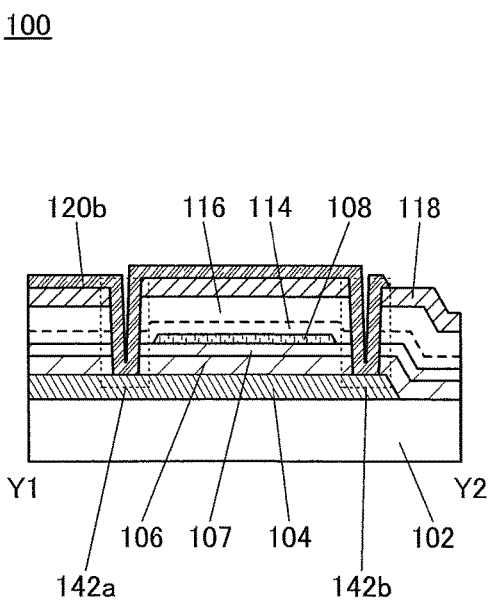

FIG. 2A is a top view of a transistor 100 that is a semiconductor device of one embodiment of the present invention. FIG. 2B is a cross-sectional view taken along a dashed dotted line X1-X2 in FIG. 2A, and FIG. 2C is a cross-sectional view taken along a dashed dotted line Y1-Y2 in FIG. 2A. Note that in FIG. 2A, some components of the transistor 100 (e.g., an insulating film serving as a gate insulating film) are not illustrated to avoid complexity. The direction of the dashed dotted line X1-X2 may be called a channel length direction, and the direction of the dashed dotted line Y1-Y2 may be called a channel width direction. As in FIG. 2A, some components are not illustrated in some cases in top views of transistors described below.

The transistor 100 includes a conductive film 104 that functions as a gate electrode over a substrate 102; an insulating film 106 over the substrate 102 and the conductive film 104; an insulating film 107 over the insulating film 106; an oxide semiconductor film 108 over the insulating film 107; conductive films 112a and 112b which function as source and drain electrodes electrically connected to the oxide semiconductor film 108; an insulating film 114 over the oxide semiconductor film 108 and the conductive films 112a and 112b; an insulating film 116 over the insulating film 114; an insulating film 118 over the insulating film 116; and conductive films 120a and 120b over the insulating film 118. The conductive film 120a is electrically connected to the conductive film 112b through an opening 142c provided in the insulating films 114, 116, and 118.

The insulating films 106 and 107 function as a first gate insulating film of the transistor 100. The insulating films 114 and 116 include oxygen and have a function of supplying oxygen to the oxide semiconductor film 108. The insulating films 114, 116, and 118 function as a second gate insulating film of the transistor 100. The insulating film 118 functions as a protective insulating film that inhibits entry of impurities into the transistor 100. The conductive film 120a functions as, for example, a pixel electrode used in a display device. The conductive film 120b functions as a second gate electrode (also referred to as a back gate electrode).

As illustrated in FIG. 2C, the conductive film 120b is electrically connected to the conductive film 104 that functions as a first gate electrode, through openings 142a and 142b provided in the insulating films 106, 107, 114, 116, and 118. Accordingly, the conductive film 120b and the conductive film 104 are supplied with the same potential.

When oxygen vacancy is formed in the oxide semiconductor film 108 included in the transistor 100, electrons serving as carriers are generated; as a result, the transistor 100 tends to be normally-on. Therefore, for stable transistor characteristics, it is preferred to reduce oxygen vacancy in the oxide semiconductor film 108. In the structure of the transistor of one embodiment of the present invention, excess oxygen is introduced into the insulating film over the oxide semiconductor film 108, here, the insulating film 114 over the oxide semiconductor film 108, whereby oxygen is moved from the insulating film 114 to the oxide semiconductor film 108 to fill oxygen vacancy in the oxide semiconductor film 108. Alternatively, excess oxygen is introduced into the insulating an 116 over the oxide semiconductor film 108, whereby oxygen is moved from the insulating film 116 to the oxide semiconductor film 108 through the insulating film 114 to fill oxygen vacancy in the oxide semiconductor film 108. Alternatively, excess oxygen is introduced into the insulating films 114 and 116 over the oxide semiconductor film 108, whereby oxygen is moved from both the insulating films 114 and 116 to the oxide semiconductor film 108 to fill oxygen vacancy in the oxide semiconductor film 108.

It is preferable that the insulating films 114 and 116 each include a region (oxygen excess region) including oxygen in excess of that in the stoichiometric composition. In other words, the insulating films 114 and 116 are preferably insulating films capable of releasing oxygen. Note that the oxygen excess region is formed in each of the insulating films 114 and 116 in such a manner that oxygen is introduced into the formed insulating films 114 and 116, for example. As a method for introducing oxygen, an ion implantation method, an ion doping method, a plasma immersion ion implantation method, plasma treatment, or the like may be employed.

The oxide semiconductor film 108 includes In and Zn. A metal M (M is Ti, Ga, Y, Zr, Sn, La, Ce, Nd, or Hf) may be further included. Typically, an In—Ga oxide, an In—Zn oxide, or an In-M-Zn oxide can be used for the oxide semiconductor film 108. It is particularly preferable to use an In-M-Zn oxide for the oxide semiconductor film 108.

The oxide semiconductor film 108 preferably includes In and Ga. In that case, it is preferable that the oxide semiconductor film 108 have a homologous structure and the content of In be larger than that of Ga. The oxide semiconductor film 108 in which the content of In is larger than that of Ga can increase the field-effect mobility (also simply referred to as mobility or μFE) of the transistor 100. Specifically, the field-effect mobility of the transistor 100 can exceed 10 $cm^2/Vs$.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

However, the electrical characteristics of the transistor 100 including the oxide semiconductor film 108 in which the content of In is larger than that of Ga are likely to be changed by light irradiation. Specifically, when the oxide semiconductor film 108 used for a channel region of the transistor 100 is irradiated with visible light or ultraviolet light, the electrical characteristics of the transistor 100 are changed in some cases.

In view of the above observations, the thickness of the oxide semiconductor film 108 in the semiconductor device of one embodiment of the present invention is greater than or equal to 5 nm and less than or equal to 50 nm, preferably greater than or equal to 5 nm and less than or equal to 35 nm, more preferably greater than or equal to 5 nm and less than or equal to 20 nm. In other words, the oxide semiconductor film 108 has a region having a thickness of greater than or equal to 5 nm and less than or equal to 50 nm.

By setting the thickness of the oxide semiconductor film 108 in the above range, light absorption by the oxide semiconductor film 108 during light irradiation can be suppressed. As a result, the change in electrical characteristics of the transistor 100 due to light irradiation can be reduced. In the semiconductor device of one embodiment of the present invention, the insulating film 114 or the insulating film 116 includes excess oxygen. This structure can further reduce the change in electrical characteristics of the transistor 100 due to light irradiation.

Here, the change in electrical characteristics of the transistor 100 due to light irradiation is described with reference to FIG. 1.

FIG. 1 shows a change in shift value, which is one of electrical characteristics of the transistor 100, due to light irradiation. In FIG. 1, the vertical axis represents ΔShift (V) and the horizontal axis represents irradiation energy (eV).

Note that the shift value means, in the drain current (ID)-gate voltage (VG) characteristics of the transistor 100, the gate voltage (VG) at a point of intersection of an axis of $1 \times 10^{-12}$ A and a tangent line of the logarithm of a drain current (ID) having the highest gradient. The ΔShift represents the change in the shift value and is obtained by subtraction of a shift value before light irradiation (i.e., an initial shift value) from a shift value under the light irradiation.

A 20-nm-thick In—Ga—Zn oxide was used as the oxide semiconductor film 108 of the transistor 100, and the results are shown in FIG. 1. The In—Ga—Zn oxide was formed using a polycrystalline metal oxide target (In:Ga:Zn=3:1:2 [at. %]) with a sputtering apparatus. Note that the band gap of the oxide semiconductor film 108 was 2.8 eV. The channel length (L) and the channel width (W) of the transistor 100 were 6 μm and 50 μm, respectively.

A voltage (VG) applied to the conductive film 104 and the conductive film 120b was changed from −15 V to +20 V in increments of 0.25 V. A voltage (VS) applied to the conductive film 112a that functions as a source electrode of the transistor 100 was 0 V (common), and a voltage (VD) applied to the conductive film 112b that functions as a drain electrode of the transistor 100 was 10 V.

Light irradiation was performed from above the oxide semiconductor film 108, (here, from the insulating film 114 side) with a spectral sensitivity measuring apparatus under the following light irradiation conditions: a light intensity of 50 μW/$cm^2$; and a light wavelength ranging from 400 nm to 495 nm, that is, an irradiation energy ranging from 2.5 eV to 3.1 eV.

FIG. 1 shows that ΔShift of the transistor 100 is greater than or equal to −1 V and less than or equal to 0.5 eV when the irradiation energy is greater than or equal to the band gap of the oxide semiconductor film 108, specifically, greater than or equal to 2.8 eV. The irradiation energy greater than or equal to the band gap of the oxide semiconductor film 108 means an irradiation energy greater than or equal to 2.8 eV, greater than or equal to 2.8 eV and less than or equal to 3.1 eV or greater than or equal to 2.8 eV and less than or equal to 3.0 eV.

With the above-described structure of the semiconductor device of one embodiment of the present invention in which the thickness of the oxide semiconductor film 108 is greater than or equal to 5 nm and less than or equal to 50 nm and the insulating film 114 or the insulating film 116 includes excess oxygen, the change in electrical characteristics of the transistor 100 due to light irradiation can be reduced. Therefore, a highly reliable semiconductor device in which the change in electrical characteristics due to light irradiation is reduced can be provided.

Oxygen in the insulating films 114 and 116 is diffused to the oxide semiconductor film 108 by heat treatment. The amount of oxygen molecules released from the insulating films 114 and 116 can be measured by thermal desorption spectroscopy (TDS).

As described above, the insulating films 114 and 116 provided over the oxide semiconductor film 108 allow oxygen in the insulating films 114 and 116 to transfer to the oxide semiconductor film 108 and fill oxygen vacancy formed in the oxide semiconductor film 108. Accordingly, a highly reliable semiconductor device can be provided.

As illustrated in FIG. 2B, the oxide semiconductor film 108 is positioned to face the conductive film 104 that functions as a first gate electrode and the conductive film 120b that functions as the second gate electrode, and is sandwiched between the two conductive films. The length in the channel length direction and the length in the channel width direction of the conductive film 120b are longer than the length in the channel length direction and the length in the channel width direction of the oxide semiconductor film 108. The whole oxide semiconductor film 108 is covered with the conductive film 120b with the insulating films 114, 116, and 118 positioned therebetween. Since the conductive film 120b is connected to the conductive film 104 through the openings 142a and 142b provided in the insulating films 106, 107, 114, 116, and 118, a side surface of the oxide semiconductor film 108 extending in the channel width direction faces the conductive film 120b.

In other words, the conductive films 104 and 120b are connected to each other through the openings provided in the insulating films 106, 107, 114, 116, and 118 and envelop the oxide semiconductor film 108 with the insulating films 106, 107, 114, 116, and 118 therebetween.

With such a structure, the oxide semiconductor film 108 included in the transistor 100 can be electrically enveloped by electric fields of the conductive films 104 and 120b. A device structure of a transistor, like the structure of the transistor 100, in which electric fields of a first gate electrode and a second gate electrode electrically envelop an oxide semiconductor film where a channel region is formed can be referred to as a surrounded channel (s-channel) structure.

Since the transistor 100 has the s-channel structure, an electric field for inducing a channel can be effectively applied to the oxide semiconductor film 108 by the conductive film 104; therefore, the current drive capability of the transistor 100 can be improved and high on-state current characteristics can be obtained. Since the on-state current can be increased, the size of the transistor 100 can be reduced. In addition, since the transistor 100 is enveloped by the conductive films 104 and 120b, the mechanical strength of the transistor 100 can be increased.

Other components of the semiconductor device of this embodiment are described in detail below.

<Substrate>

There is no particular limitation on the property of a material and the like of the substrate 102 as long as the material has heat resistance enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<First Gate Electrode, Source Electrode, and Drain Electrode>

The conductive film 104 that functions as the first gate electrode and the conductive films 112a and 112b which function as source and drain electrodes can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these elements; or the like.

The conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, or a three-layer structure in which a titanium film, an aluminum film, and a titanium film are stacked in this order can be employed. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide (hereinafter, also referred to as ITO), indium oxide including tungsten oxide, indium zinc oxide including tungsten oxide, indium oxide including titanium oxide, indium tin oxide including titanium oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<First Gate Insulating Film>

As each of the insulating films 106 and 107 which function as the first gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 functions as a blocking film which inhibits permeation of oxygen. For example, in the case where excess oxygen is supplied to the insulating film 107, the insulating film 114, the insulating film 116, and/or the oxide semiconductor film 108, oxygen is prevented from permeating the insulating film 106.

Note that the insulating film 107 that is in contact with the oxide semiconductor film 108 is preferably an oxide insulating film and preferably includes a region including oxygen in excess of the stoichiometric composition (oxygen-excess region). In other words, the insulating film 107 is an insulating film which is capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, the insulating film 107 using hafnium oxide can have a larger thickness than the insulating film 107 using silicon oxide; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the physical thickness of the insulating film can be increased. This makes it possible to suppress a decrease in withstand voltage of the transistor 100 and furthermore to increase the withstand voltage, thereby preventing electrostatic discharge damage to the transistor 100.

<Oxide Semiconductor Film>

An In—Ga oxide, an In—Zn oxide, or an In-M-Zn oxide can be used for the oxide semiconductor film 108. It is particularly preferable to use an In-M-Zn oxide for the oxide semiconductor film 108.

In the case where the oxide semiconductor film 108 is formed of In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratios of metal elements in the formed oxide semiconductor film 108 may be different from the above atomic ratio of metal elements of the sputtering target within a range of approximately ±40%. For example, when a sputtering target with an atomic ratio of In to Ga and Zn of 4:2:4.1 is used, the atomic ratio of In to Ga and Zn in the oxide semiconductor film 108 may be approximately 4:2:3.

Note that in the case where the oxide semiconductor film 108 is formed of In-M-Zn oxide, the proportion of In and the proportion of M, not taking Zn and O into consideration, are preferably greater than 25 atomic % and less than 75 atomic %, respectively, and more preferably greater than 34 atomic % and less than 66 atomic %, respectively.

The energy gap of the oxide semiconductor film 108 is 2 eV or more, preferably 2.5 eV or more, or further preferably 3 eV or more. With the use of an oxide semiconductor having such a wide energy gap, the off-state current of the transistor 100 can be reduced.

An oxide semiconductor film with low carrier density is used as the oxide semiconductor film 108. For example, an oxide semiconductor film whose carrier density is lower than $8\times10^{11}/cm^3$, preferably lower than $1\times10^{11}/cm^3$, or further preferably lower than $1\times10^{10}/cm^3$, and greater than or equal to $1\times10^{-9}/cm^3$ is used as the oxide semiconductor film 108.

Note that, without limitation to the compositions and materials described above, a material with an appropriate composition may be used depending on required semiconductor characteristics and electrical characteristics (e.g., field-effect mobility and threshold voltage) of a transistor. In order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108 be set to be appropriate.

Note that it is preferable to use, as the oxide semiconductor film 108, an oxide semiconductor film in which the impurity concentration is low and density of defect states is low, in which case the transistor can have more excellent electrical characteristics. Here, the state in which impurity concentration is low and density of defect states is low (the amount of oxygen vacancy is small) is referred to as "highly purified intrinsic" or "substantially highly purified intrinsic". It is also possible to call this state "intrinsic" or "substantially intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Furthermore, the highly purified intrinsic or substantially highly purified intrinsic oxide semiconductor film has an extremely low off-state current; even when an element has a channel width W of $1\times10^6$ μm and a channel length L of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to form water, and also causes oxygen vacancy in a lattice from which oxygen is released (or a portion from which oxygen is released). Due to entry of hydrogen into the oxygen vacancy, an electron serving as a carrier can be generated. Furthermore, in some cases, bonding of hydrogen to oxygen bonded to a metal element causes generation of an electron serving as a carrier. Thus, a transistor including an oxide semiconductor film which contains hydrogen is readily transformed to be normally on. Accordingly, it is preferable that hydrogen be reduced as much as possible in the oxide semiconductor film 108. Specifically, in the oxide semiconductor film 108, the concentration of hydrogen which is measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, or further preferably lower than or equal to $1\times10^{16}$ atoms/cm$^3$.

When silicon or carbon that is one of elements belonging to Group 14 is included in the oxide semiconductor film 108, oxygen vacancy is increased in the oxide semiconductor film 108, and the oxide semiconductor film 108 becomes an n-type film. Thus, the concentration of silicon or carbon (the concentration measured by SIMS) in the oxide semiconductor film 108 or at its interface with other films is set to be lower than or equal to $2\times10^{18}$ atoms/cm$^3$, or preferably lower than or equal to $2\times10^{17}$ atoms/cm$^3$.

The concentration of alkali metal or alkaline earth metal of the oxide semiconductor film 108, which is measured by SIMS, is lower than or equal to $1\times10^{18}$ atoms/cm$^3$, or preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108.

When including nitrogen, the oxide semiconductor film 108 easily becomes n-type by generation of electrons serving as carriers and an increase of carrier density. Thus, a transistor including an oxide semiconductor film which contains nitrogen readily has normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

The oxide semiconductor film 108 may have a non-single-crystal structure, for example. The non-single crystal structure includes a c-axis aligned crystalline oxide semiconductor (CAAC-OS) which is described later, a polycrystalline structure, a microcrystalline structure, or an amorphous structure, for example. Among the non-single crystal structure, the amorphous structure has the highest density of defect states, whereas CAAC-OS has the lowest density of defect states.

The oxide semiconductor film 108 may have an amorphous structure, for example. The oxide semiconductor films having the amorphous structure each have disordered atomic arrangement and no crystalline component, for example. Alternatively, the oxide films having an amorphous structure have, for example, an absolutely amorphous structure and no crystal part.

Note that the oxide semiconductor film 108 may be a single film or stacked films each including two or more of the following regions: a region having an amorphous structure, a region having a microcrystalline structure, a region having a polycrystalline structure, a region of CAAC-OS, and a region having a single-crystal structure.

<Insulating Film Functioning as Second Gate Insulating Film>

The insulating films 114 and 116 each have a function of supplying oxygen to the oxide semiconductor film 108. The insulating film 118 functions as a protective insulating film for the transistor 100. The insulating films 114 and 116 include oxygen. The insulating film 114 is an insulating film that is permeable to oxygen. Note that the insulating film 114 also functions as a film that relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, or preferably greater than or equal to 5 nm and less than or equal to 50 nm, can be used as the insulating film 114.

It is preferable that the number of defects in the insulating film 114 be small and typically the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating film 114 is high, oxygen is bonded to the defects and the amount of oxygen that permeates through the insulating film 114 is decreased.

Note that all oxygen entering the insulating film 114 from the outside does not move to the outside of the insulating film 114 and some oxygen remains in the insulating film 114. Furthermore, movement of oxygen may occur in the insulating film 114 in such a manner that oxygen enters the insulating film 114 and oxygen originally included in the insulating film 114 moves to the outside of the insulating film 114. When an oxide insulating film which is permeable to oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the oxide insulating film in which the density of states due to nitrogen oxide is low between $E_{v\_os}$ and $E_{c\_os}$.

Note that a silicon oxynitride film that releases less nitrogen oxide is a film of which the amount of released ammonia is larger than the amount of released nitrogen oxide in thermal desorption spectroscopy analysis; the amount of released ammonia is typically greater than or equal to $1\times10^{18}$/cm$^3$ and less than or equal to $5\times10^{19}$/cm$^3$ at a temperature higher than or equal to 50° C. and lower than or equal to 650° C. or higher than or equal to 50° C. and lower than or equal to 550° C.

Nitrogen oxide ($NO_x$; x is 1 or 2), typically $NO_2$ or NO, forms levels in the insulating film 114 and the like. The level is positioned in the energy gap of the oxide semiconductor film 108. Therefore, when nitrogen oxide is diffused to the interface between the insulating film 114 and the oxide semiconductor film 108, an electron is trapped by the level on the insulating film 114 side. As a result, the trapped electron remains at or near the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the oxide semiconductor film 108.

By using, for the insulating film 114, the oxide insulating film having a low density of states due to nitrogen oxide between $E_{v\_os}$ and $E_{c\_os}$, the shift in the threshold voltage of the transistor can be reduced, which leads to a smaller change in the electrical characteristics of the transistor.

Note that heat treatment of a manufacturing process of the transistor, typically heat treatment at a temperature higher than or equal to 300° C. and lower than the strain point of the substrate, allows the insulating film 114 to give a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 in an ESR spectrum at 100 K or lower. The split width of the first and second signals and the split width of the second and third signals that are obtained by ESR measurement using an X-band are each approximately 5 mT. The sum of the densities of the spin attributed to the first signal, the second signal, and the third signal is lower than $1\times10^{18}$ spins/cm$^3$, typically higher than or equal to $1\times10^{17}$ spins/cm$^3$ and lower than $1\times10^{18}$ spins/cm$^3$.

The first signal, the second signal, and the third signal correspond to signals attributed to nitrogen oxide. In other words, the lower the total density of the spin attributed to the first signal, the second signal, and the third signal is, the lower the content of nitrogen oxide in the oxide insulating film is.

The nitrogen concentration of the oxide insulating film having a low density of states due to nitrogen oxide between $E_{v\_os}$ and $E_{c\_os}$ measured by SIMS is lower than or equal to $6\times10^{20}$ atoms/cm$^3$.

The oxide insulating film in which the density of states due to nitrogen oxide is low between $E_{v\_os}$ and $E_{c\_os}$ is formed by a PECVD method at a substrate temperature higher than or equal to 220° C., higher than or equal to 280° C., or higher than or equal to 350° C. using silane and dinitrogen monoxide, whereby a dense and hard film can be formed.

The insulating film 116 is formed using an oxide insulating film that includes oxygen in excess of that in the stoichiometric composition. Part of oxygen is released by heating from an oxide insulating film including oxygen in excess of that in the stoichiometric composition. An oxide insulating film including oxygen in excess of that in the stoichiometric composition is an oxide insulating film of which the amount of released oxygen converted into oxygen atoms is greater than or equal to $1.0\times10^{19}$ atoms/cm$^3$, or greater than or equal to $3.0\times10^{20}$ atoms/cm$^3$, in TDS analysis at a temperature higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, or preferably greater than or equal to 50 nm and less than or equal to 400 nm, can be used as the insulating film 116.

It is preferable that the number of defects in the insulating film 116 be small, and typically the spin density corresponding to a signal which appears at g=2.001 due to a dangling bond of silicon be lower than $1.5\times10^{18}$ spins/cm$^3$, or further preferably lower than or equal to $1\times10^{18}$ spins/cm$^3$ in an ESR measurement. Note that the insulating film 116 is provided more apart from the oxide semiconductor film 108 than the insulating film 114 is; thus, the insulating film 116 may have higher density of defects than the insulating film 114.

The insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be used without the formation of the insulating film 116.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film can be used as the insulating film 118, for example. As the nitride insulating film, a silicon nitride film, a silicon nitride oxide film, an aluminum nitride film, an aluminum nitride oxide film, and the like can be given. Note that instead of the nitride insulating film, an oxide insulating film having a blocking effect against oxygen, hydrogen, water, and the like, may be provided. As such an oxide insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the aforementioned films including the conductive films, the insulating films, and the oxide semiconductor film can be formed by a sputtering method or a PECVD method, they may be formed by another method, e.g., a thermal CVD method or an atomic layer deposition (ALD) method. As an example of a thermal CVD method, a metal organic chemical vapor deposition (MOCVD) method can be given.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and the source gas and the oxidize are reacted with each other in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then the sequence of the gas introduction is repeated. An inert gas (e.g., argon or nitrogen) may be introduced as a carrier gas with the source gases. For example, two or more kinds of source gases may be sequentially supplied to the chamber. In this case, after the reaction of a first source gas, an inert gas is introduced, and then a second source gas is introduced so that the source gases are not mixed. Alternatively, the first source gas may be exhausted by vacuum evacuation instead of the introduction of the inert gas, and then the second source gas may be introduced. The first source gas is adsorbed on the surface of the substrate and reacted to form a first layer; then the second source gas introduced thereafter is absorbed and reacted; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the gas introduction; therefore, an ALD method makes it possible to accurately adjust a thickness and thus is suitable for manufacturing a minute FET.

The films such as the conductive films, the insulating films, the oxide semiconductor films, and the metal oxide films which are described above can be formed by a thermal CVD method such as an MOCVD method. For example, in the case where an In—Ga—Zn—O film is formed, trimethylindium ($In(CH_3)_3$), trimethylgallium ($Ga(CH_3)_3$), and dimethylzinc ($Zn(CH_3)_2$) are used. Without limitation to the above combination, triethylgallium can be used instead of trimethylgallium and diethylzinc can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor (e.g., a hafnium alkoxide or a hafnium amide such as tetrakis(dimethylamide)hafnium (TDMAH, $Hf[N(CH_3)_2]_4$) and tetrakis(ethyhnethylamide) hafnium) are used.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are sequentially introduced to form an initial tungsten film, and then a tungsten film is formed using a $WF_6$ gas and an $H_2$ gas. Note that an $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are used to form an InO layer, a GaO layer is formed using a $Ga(CH_3)_3$ gas and an $O_3$ gas, and then a ZnO layer is formed using a $Zn(CH_3)_2$ gas and an $O_3$ gas. Note that the order of these layers is not limited to this example. A mixed compound layer such as an In—Ga—O layer, an In—Zn—O layer, or a Ga—Zn—O layer may be formed by using these gases. Note that although an $H_2O$ gas which is obtained by bubbling with an inert gas such as Ar may be used instead of an $O_3$ gas, it is preferable to use an $O_3$ gas, which does not contain H.

Structure Example 2 of Semiconductor Device

A structure example different from that of the transistor 100 in FIGS. 2A to 2C is described with reference to FIGS. 3A to 3C. Note that in the case where a portion has a function similar to that described above, the same hatch pattern is applied to the portion, and the portion is not especially denoted by a reference numeral in some cases.

Figure 3A:
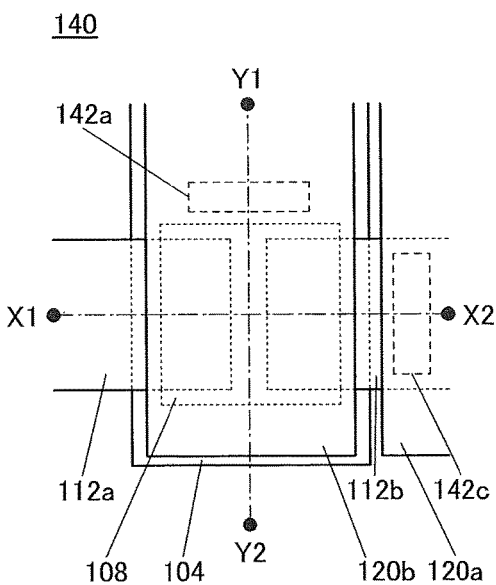
FIGS. 3A to 3C are a top view and cross-sectional views illustrating one embodiment of a semiconductor device.

FIG. 3A is a top view of a transistor 140 that is a semiconductor device of one embodiment of the present invention. FIG. 3B is a cross-sectional view taken along dashed-dotted line X1-X2 illustrated in FIG. 3A, and FIG. 3C is a cross-sectional view taken along dashed-dotted line Y1-Y2 illustrated in FIG. 3A.

The transistor 140 is different from the transistor 100 described above in that the opening 142b is not provided. The structure except for the opening 142b is the same as the structure of the transistor 100, and the detailed description thereof is omitted.

Figure 3B:
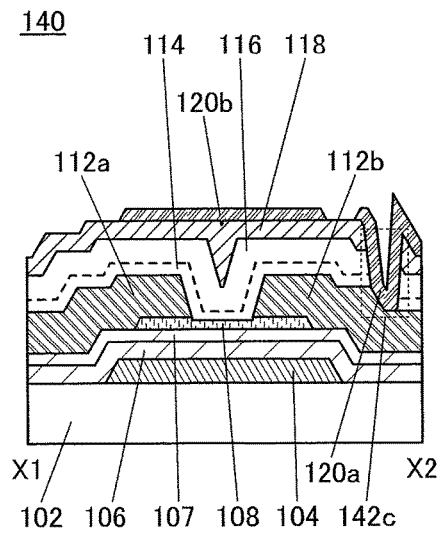
Figure 3C:
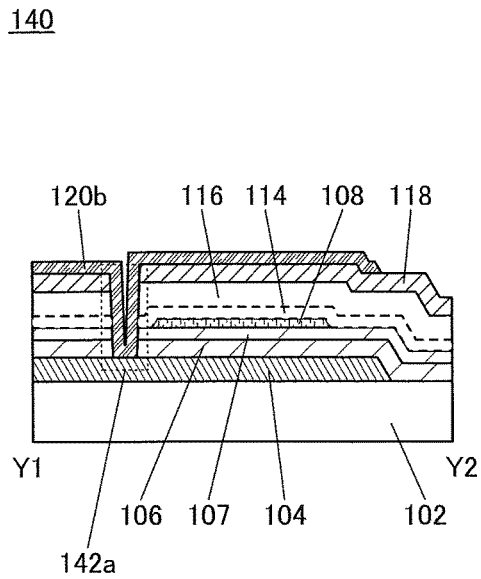

As illustrated in FIGS. 3A and 3C, the opening 142a may be provided for electrically connecting the conductive film 104 that functions as the first gate electrode to the conductive film 120b that functions as the second gate electrode.

Structure Example 3 of Semiconductor Device

A structure example different from that of the transistor 100 in FIGS. 2A to 2C is described with reference to FIGS. 4A to 4C. Note that in the case where a portion has a function similar to that described above, the same hatch pattern is applied to the portion, and the portion is not especially denoted by a reference numeral in some cases.

Figure 4A:
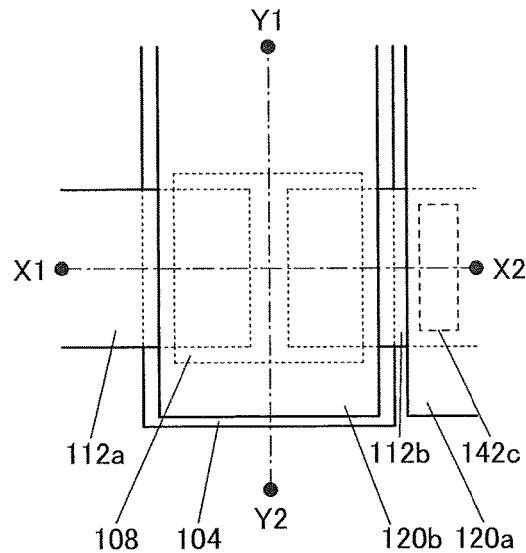
FIGS. 4A to 4C are a top view and cross-sectional views illustrating one embodiment of a semiconductor device.

FIG. 4A is a top view of a transistor 160 that is a semiconductor device of one embodiment of the present invention. FIG. 4B is a cross-sectional view taken along a dashed dotted line X1-X2 in FIG. 4A. FIG. 4C is a cross-sectional view taken along a dashed dotted line Y1-Y2 in FIG. 4A.

The transistor 160 is different from the transistor 100 described above in that the openings 142a and 142b are not provided. The structure except for the openings 142a and 142b is the same as the structure of the transistor 100, and the detailed description thereof is omitted.

Figure 4B:
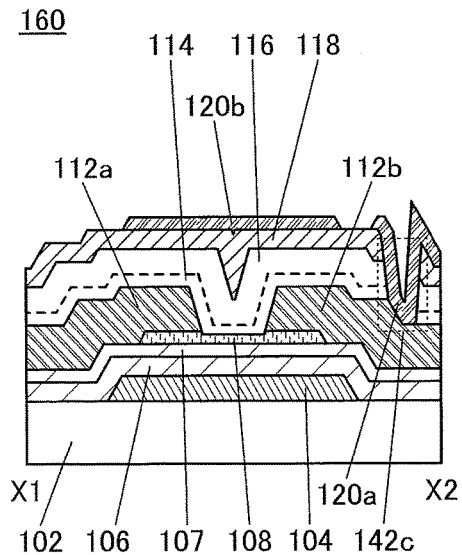
Figure 4C:
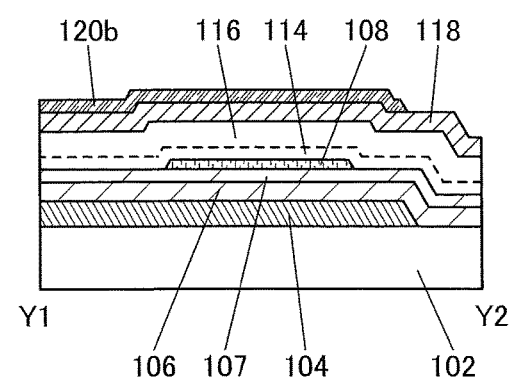

In the case of the structure illustrated in FIGS. 4A and 4C, different potentials can be applied to the conductive film 104 and the conductive film 120b.

Structure Example 4 of Semiconductor Device

A structure example different from that of the transistor 100 in FIGS. 2A to 2C is described with reference to FIGS. 5A to 5F. Note that in the case where a portion has a function similar to that described above, the same hatch pattern is applied to the portion, and the portion is not especially denoted by a reference numeral in some cases.

Figure 5A:
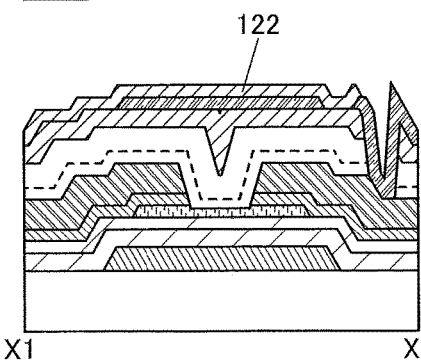
FIGS. 5A to 5F are cross-sectional views illustrating embodiments of a semiconductor device.
Figure 5B:
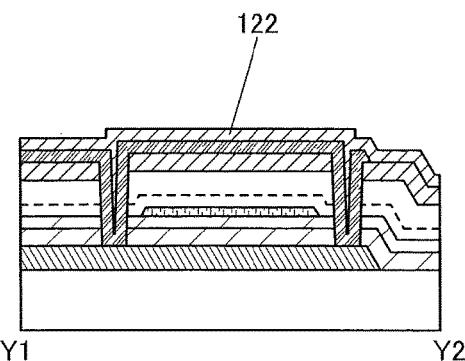
Figure 5C:
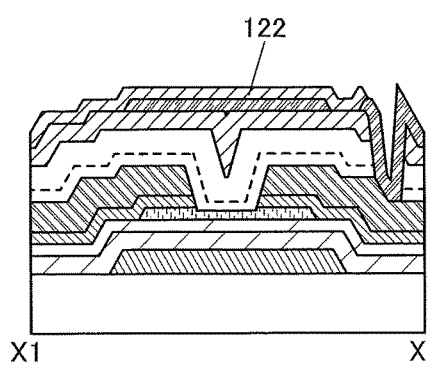
Figure 5D:
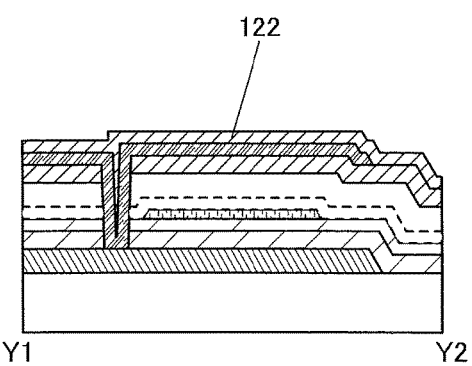
Figure 5E:
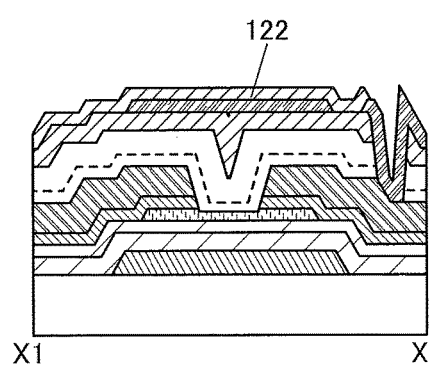
Figure 5F:
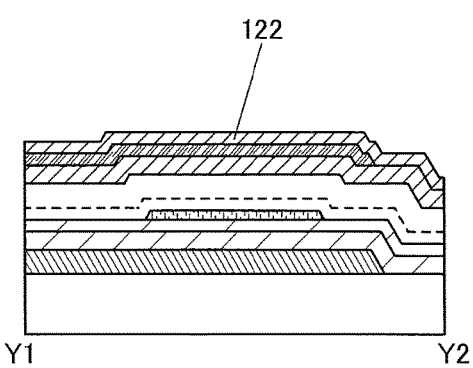

FIG. 5A is a cross-sectional view in the channel length direction of a transistor 100A, and FIG. 5B is a cross-sectional view in the channel width direction of the transistor 100A. Note that top views of the transistors 100A, 140A, and 160A are the same as the top views in FIG. 2A, FIG. 3A, and FIG. 4A, respectively, and the description thereof is omitted here.

The transistors 100A, 140A, and 160A are modification examples of the above-described transistors 100, 140, and 160, respectively, and different from the transistors 100, 140, and 160 in that the insulating film 122 is provided over the transistors 100, 140, and 160, specifically, over the insulating film 118 and the conductive films 120a and 120b. The structure except for the insulating film 122 is the same as the structures of the transistors 100, 140, and 160, and the detailed description thereof is omitted.

The insulating film 122 can be formed using a material similar to a material that can be used for the insulating film 118. The insulating film 122 may be provided to cover the conductive film 120b and expose part of the conductive film 120a. Since the insulating film 122 is provided, the conductive film 120b can be protected and thus a highly reliable semiconductor device can be obtained.

Figure 6A:
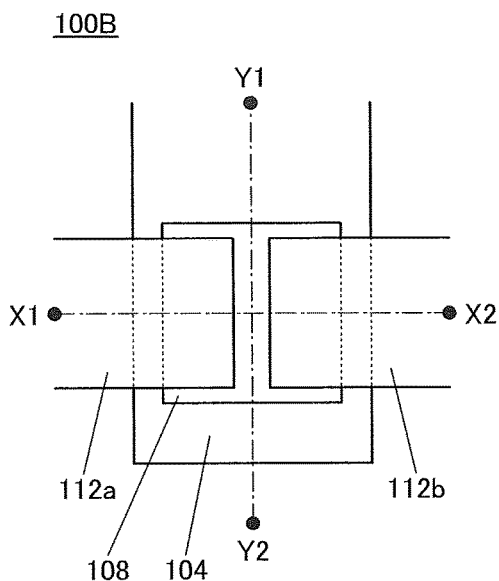
FIGS. 6A to 6C are a top view and cross-sectional views illustrating one embodiment of a semiconductor device.
Figure 6B:
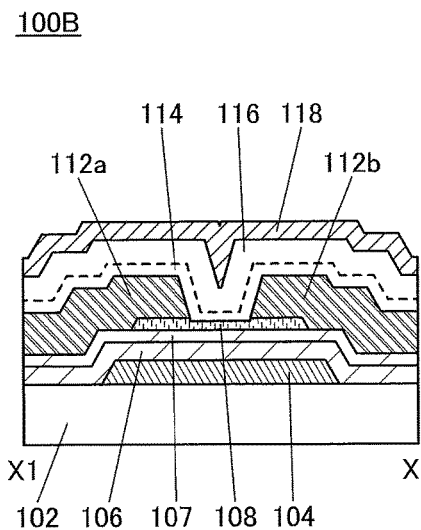
Figure 6C:
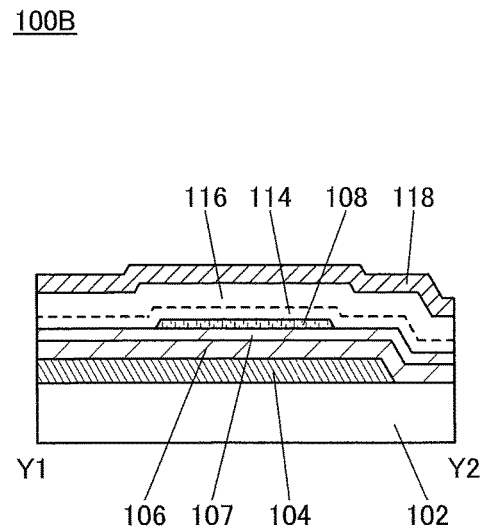
Figure 7A:
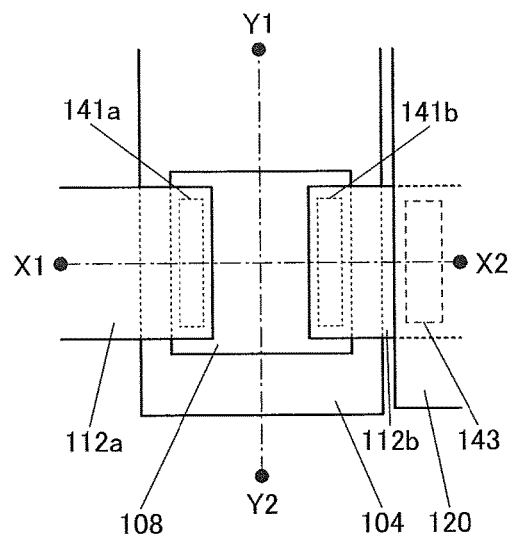
FIGS. 7A to 7C are a top view and cross-sectional views illustrating one embodiment of a semiconductor device.
Figure 7B:
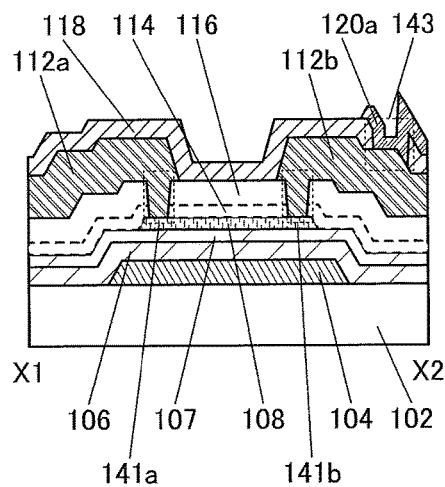
Figure 7C:
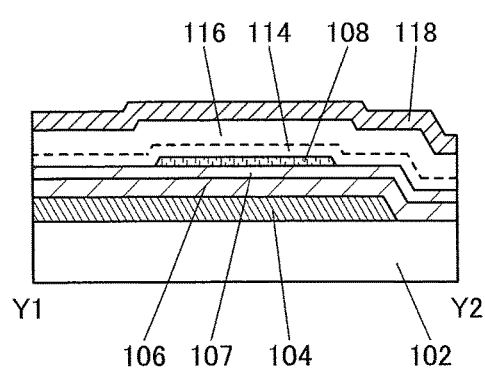
Figure 8A:
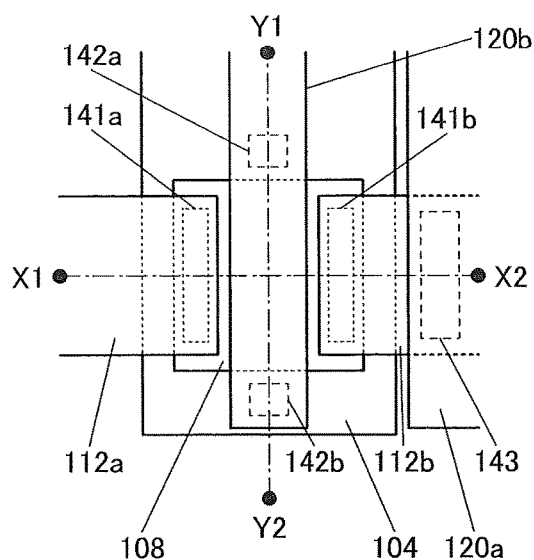
FIGS. 8A to 8C are a top view and cross-sectional views illustrating one embodiment of a semiconductor device.
Figure 8B:
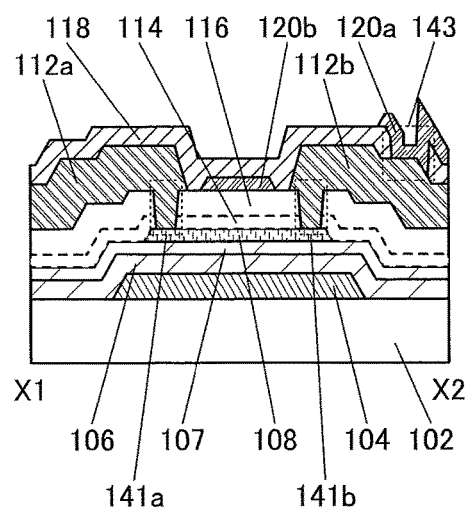
Figure 8C:
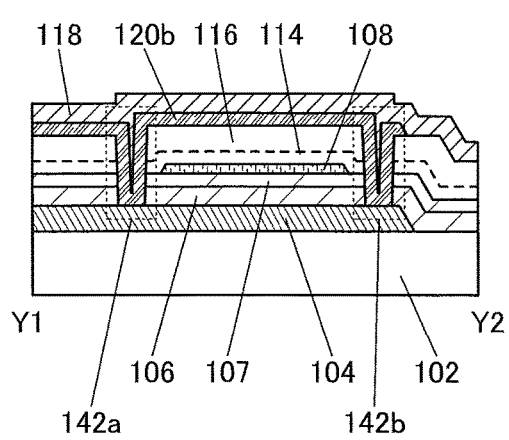

The semiconductor device of one embodiment of the present invention may be a transistor 100B in FIGS. 6A to 6C, a transistor 100C in FIGS. 7A to 7C, or a transistor 100D in FIGS. 8A to 8C. The transistor 100B in FIGS. 6A to 6C is a channel-etched transistor. The transistor 100C in FIGS. 7A to 7C and the transistor 100D in FIGS. 8A to 8C are channel-protective transistors. In the transistor 100C and the transistor 100D, openings 141a and 141b are provided in the insulating films 114 and 116, and an opening 143 is provided in the insulating film 118.

The structures of the transistors of this embodiment can be freely combined with each other.

<Method 1 for Manufacturing Semiconductor Device>

Next, a method for manufacturing the transistor 100 that is a semiconductor device of one embodiment of the present invention is described in detail below with reference to FIGS. 9A to 9H, FIGS. 10A to 10F, and FIGS. 11A and 11H. FIGS. 9A to 9H, FIGS. 10A to 10F, and FIGS. 11A and 11H are cross-sectional views illustrating a method for manufacturing a semiconductor device. FIGS. 9A, 9C, 9E and 9G, FIGS. 10A, 10C, and 10E, and FIGS. 11A, 11C, 11E and 11G are cross-sectional views in the channel length direction of the transistor 100 in the manufacturing process. FIGS. 9B, 9D, 9F and 9H, FIGS. 10B, 10D, and 10F, and FIGS. 11B, 11D, 11F and 11H are cross-sectional views in the channel width direction of the transistor 100 in the manufacturing process.

Note that, as mentioned above, the films included in the transistor 100 (i.e., the insulating film, the oxide semiconductor film, the conductive film, and the like) can be formed by any of a sputtering method, a CVD method, a vacuum evaporation method, and a pulsed laser deposition (PLD) method. Alternatively, a coating method or a printing method can be used. Although the sputtering method and a PECVD method are typical examples of the film formation method, a thermal CVD method or an ALD method may be used. As the thermal CVD method, an MOCVD method may be used, for example.

First, a conductive film is formed over the substrate 102 and processed through a lithography process and an etching process, whereby the conductive film 104 that functions as the first gate electrode is formed. Then, the insulating films 106 and 107 which function as the first gate insulating film are formed over the conductive film 104 (see FIGS. 9A and 9B).

In this embodiment, a glass substrate is used as the substrate 102, and as the conductive film 104, a 100-nm-thick tungsten film is formed by a sputtering method.

In this embodiment, a 400-nm-thick silicon nitride film as the insulating film 106 and a 50-nm-thick silicon oxynitride film as the insulating film 107 are formed by a PECVD method.

Note that the insulating film 106 can have a stacked-layer structure of silicon nitride films. Specifically, the insulating film 106 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C.

In the case where a conductive film including Cu is used as the conductive film 104, the use of the three-layer structure of silicon nitride films for the insulating film 106 provides the following effect.

The first silicon nitride film can inhibit diffusion of a copper (Cu) element from the conductive film 104. The second silicon nitride film has a function of releasing hydrogen and can improve withstand voltage of the insulating film that functions as a gate insulating film. The third silicon nitride film releases a negligible amount of hydrogen and can inhibit diffusion of hydrogen released from the second silicon nitride film.

The insulating film 107 is preferably an insulating film including oxygen to improve characteristics of an interface with the oxide semiconductor film 108 formed later.

Figure 9A:
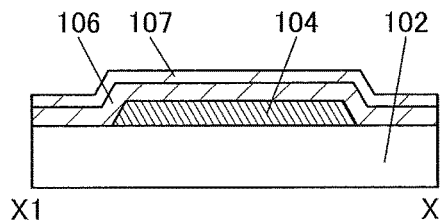
FIGS. 9A to 9H are cross-sectional views illustrating an example of a process of manufacturing a semiconductor device.
Figure 9B:
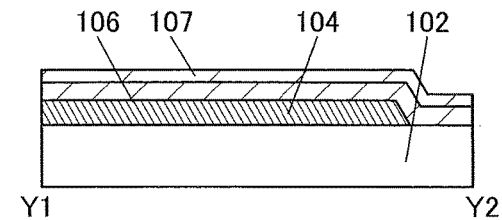
Figure 9C:
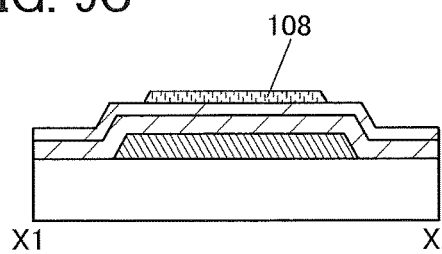
Figure 9D:
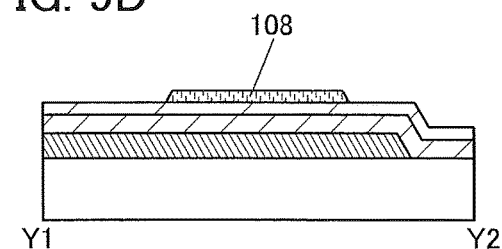

Next, the oxide semiconductor film 108 is formed over the insulating film 107 (see FIGS. 9C and 9D).

In this embodiment, an oxide semiconductor film is formed by a sputtering method using an In—Ga—Zn metal oxide target (having an atomic ratio of In:Ga:Zn=3:1:2), a mask is formed over the oxide semiconductor film through a lithography process, and the oxide semiconductor film is processed into a desired region, whereby the oxide semiconductor film 108 having an island shape is formed.

After the oxide semiconductor film 108 is formed, heat treatment may be performed at a temperature higher than or equal to 150° C. and lower than the strain point of the substrate, preferably higher than or equal to 200° C. and lower than or equal to 450° C., or further preferably higher than or equal to 300° C. and lower than or equal to 450° C. The heat treatment performed here serves as one kind of treatment for increasing the purity of the oxide semiconductor film and can reduce hydrogen, water, and the like included in the oxide semiconductor film 108. Note that the heat treatment may be performed before the oxide semiconductor film 108 is processed into an island shape.

An electric furnace, a rapid thermal anneal (RTA) apparatus, or the like can be used for the heat treatment performed on the oxide semiconductor film 108. With the use of an RTA apparatus, the heat treatment can be performed at a temperature higher than or equal to the strain point of the substrate if the heating time is short. Therefore, the heat treatment time can be shortened.

Note that the heat treatment performed on the oxide semiconductor film 108 may be performed under an atmosphere of nitrogen, oxygen, ultra-dry air (air in which a water content is 20 ppm or less, preferably 1 ppm or less, or further preferably 10 ppb or less), or a rare gas (argon, helium, or the like). The atmosphere of nitrogen, oxygen, ultra-dry air, or a rare gas preferably does not contain hydrogen, water, and the like. Furthermore, after heat treatment performed under a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancy in the oxide semiconductor film can be reduced.

In the case where the oxide semiconductor film 108 is formed by aسputtering method, as a sputtering gas, a rare gas (typically argon), oxygen, or a mixed gas of a rare gas and oxygen is used as appropriate. In the case of using the mixed gas of a rare gas and oxygen, the proportion of oxygen may be higher than that of a rare gas. In addition, increasing the purity of a sputtering gas is preferred. For example, as an oxygen gas or an argon gas used for a sputtering gas, a gas which is highly purified to have a dew point of −40° C. or lower, preferably −80° C. or lower, further preferably −100° C. or lower, or still further preferably −120° C. or lower is used, whereby entry of moisture and the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film 108, as much as possible. Alternatively, a turbo molecular pump and a cold trap are preferably combined so as to prevent a backflow of a gas, especially a gas including carbon or hydrogen, from an exhaust system to the inside of the chamber.

Figure 9E:
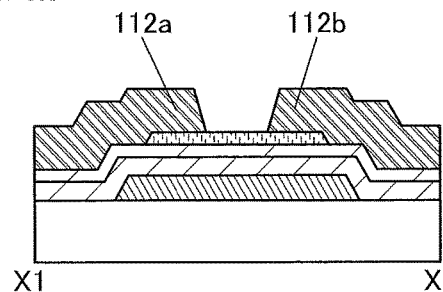
Figure 9F:
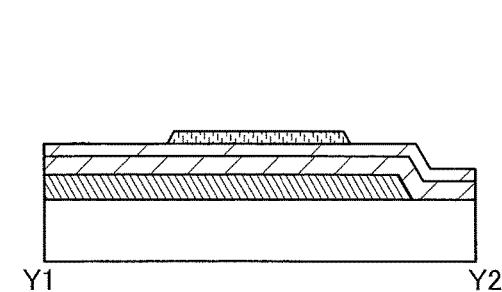

Next, the conductive films 112a and 112b which function as source and drain electrodes are formed over the insulating film 107 and the oxide semiconductor film 108 (see FIGS. 9E and 9F).

In this embodiment, the conductive films 112a and 112b are formed in the following manner: a stack formed of a 50-nm-thick tungsten film and a 400-nm-thick aluminum film is formed by a sputtering method, a mask is formed over the stack through a lithography process, and the stack is processed into desired regions. Although the conductive films 112a and 112b each have a two-layer structure in this embodiment, one embodiment of the present invention is not limited thereto. For example, the conductive films 112a and 112b each may have a three-layer structure of a 50-nm-thick tungsten film, a 400-nm-thick aluminum film, and a 100-nm-thick titanium film.

Figure 9G:
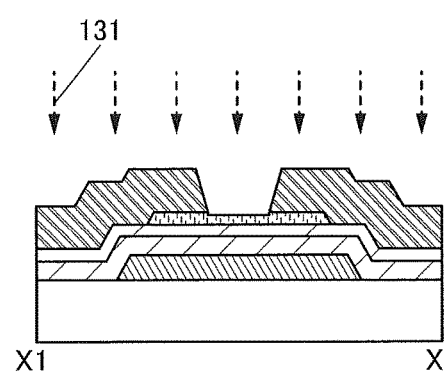
Figure 9H:
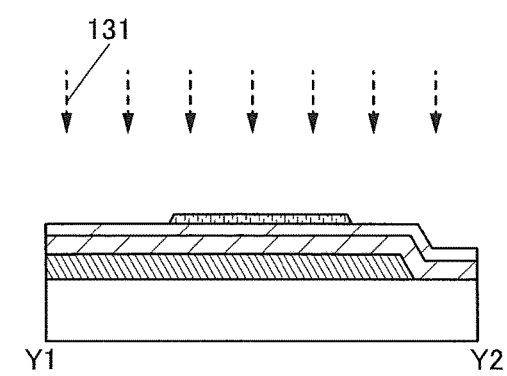

Next, an etchant 131 is applied onto the insulating film 107, the oxide semiconductor film 108, and the conductive films 112a and 112b for cleaning a surface of the oxide semiconductor film 108 (on the back channel side) (see FIGS. 9G and 9H).

The cleaning may be performed, for example, using an etchant such as an aqueous solution of phosphoric acid, by which impurities (e.g., an element included in the conductive films 112a and 112b) attached to the surface of the oxide semiconductor film 108 can be removed. Note that cleaning steps illustrated in FIGS. 9G and 9H are not necessarily performed, and in some cases, the cleaning does not needed.

Note that a recessed portion might be formed in part of the oxide semiconductor film 108 at the step of forming the conductive films 112a and 112b and/or the cleaning steps.

Figure 10A:
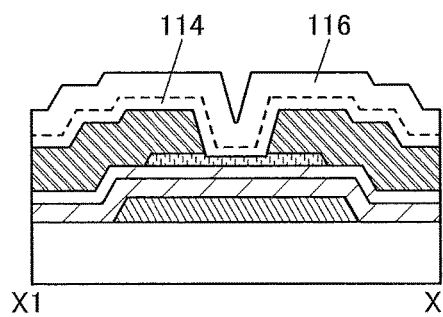
FIGS. 10A to 10F are cross-sectional views illustrating an example of a process of manufacturing a semiconductor device.
Figure 10B:
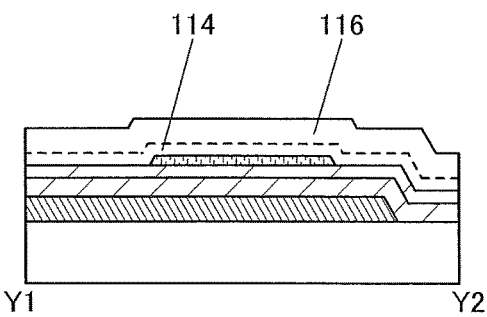

Next, over the insulating film 107, the oxide semiconductor film 108, and the conductive films 112a and 112b, the insulating films 114 and 116 are formed (see FIGS. 10A and 10B).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced, and oxygen in the insulating films 114 and 116 can be moved to the oxide semiconductor film 108; accordingly, the amount of oxygen vacancy in the oxide semiconductor film 108 can be reduced.

For example, as the insulating film 114, a silicon oxynitride film is formed by a PECVD method. In this case, a deposition gas including silicon and an oxidizing gas are preferably used as a source gas. Typical examples of the deposition gas including silicon include silane, disilane, trisilane, and silane fluoride. Examples of the oxidizing gas include dinitrogen monoxide and nitrogen dioxide. An insulating film including nitrogen and having a small number of defects can be formed as the insulating film 114 by a PECVD method under the conditions where the ratio of the oxidizing gas to the deposition gas is higher than 20 times and lower than 100 times, or preferably higher than or equal to 40 times and lower than or equal to 80 times, and the pressure in a treatment chamber is lower than 100 Pa, or preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6\times10^{-2}$ W/cm$^2$ as the power density) is supplied to parallel-plate electrodes.

As the insulating film 116, a silicon oxide film or a silicon oxynitride film is formed under the conditions where the substrate placed in a treatment chamber of the PECVD apparatus that is vacuum-evacuated is held at a temperature higher than or equal to 180° C. and lower than or equal to 280° C., or preferably higher than or equal to 200° C. and lower than or equal to 240° C., the pressure is greater than or equal to 100 Pa and less than or equal to 250 Pa, or preferably greater than or equal to 100 Pa and less than or equal to 200 Pa, with introduction of a source gas into the treatment chamber, and a high-frequency power greater than or equal to 0.17 W/cm$^2$ and less than or equal to 0.5 W/cm$^2$, or preferably greater than or equal to 0.25 W/cm$^2$ and less than or equal to 0.35 W/cm$^2$, is supplied to an electrode provided in the treatment chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, an oxide insulating film which includes oxygen in excess of that in the stoichiometric composition and from which part of oxygen is released by heating can be formed.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas including silicon with respect to the oxidizing gas is increased, the number of defects in the insulating film 116 can be reduced. Typically, it is possible to form an oxide insulating layer in which the number of defects is small, i.e., the spin density corresponding to a signal which appears at g=2.001 originating from a dangling bond of silicon is lower than $6 \times 10^{17}$ spins/cm$^3$, lower than or equal to $3 \times 10^{17}$ spins/cm$^3$, or lower than or equal to $1.5 \times 10^{17}$ spins/cm$^3$, in an ESR measurement. As a result, the reliability of the transistor can be improved.

Heat treatment may be performed after the insulating films 114 and 116 are formed. The heat treatment can reduce nitrogen oxide included in the insulating films 114 and 116. By the heat treatment, part of oxygen included in the insulating films 114 and 116 can be moved to the oxide semiconductor film 108, so that the amount of oxygen vacancy included in the oxide semiconductor film 108 can be reduced.

The temperature of the heat treatment performed on the insulating films 114 and 116 is typically higher than or equal to 150° C. and lower than or equal to 400° C., preferably higher than or equal to 300° C. and lower than or equal to 400° C., or further preferably higher than or equal to 320° C. and lower than or equal to 370° C. The heat treatment may be performed under an atmosphere of nitrogen, oxygen, ultra-dry air (air in which a water content is 20 ppm or less, preferably 1 ppm or less, or further preferably 10 ppb or less), or a rare gas (argon, helium, and the like). Note that an electric furnace, an RTA apparatus, and the like can be used for the heat treatment, in which it is preferable that hydrogen, water, and the like not be included in the nitrogen, oxygen, ultra-dry air, or rare gas.

In this embodiment, the heat treatment is performed at 350° C. under a nitrogen atmosphere for 1 hour.

Figure 10C:
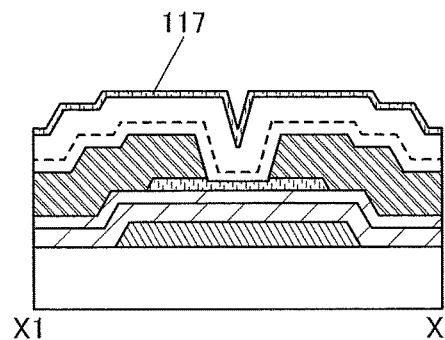
Figure 10D:
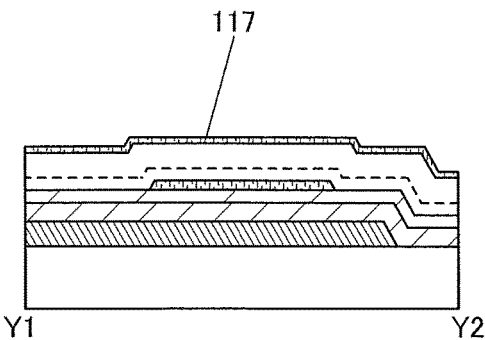

Next, a protection film 117 is formed over the insulating film 116 (see FIGS. 10C and 10D).

The protection film 117 includes at least one of indium, zinc, titanium, aluminum, tungsten, tantalum, and molybdenum. For example, a conductive material such as an alloy including any of the metal elements, an alloy including any of the metal elements in combination, a metal oxide including any of the metal elements, a metal nitride including any of the metal elements, or a metal nitride oxide including any of the metal elements is used.

The protection film 117 can be formed using, for example, a tantalum nitride film, a titanium film, an ITO film, an aluminum film, or an oxide semiconductor film (e.g., an IGZO film having an atomic ratio of In:Ga:Zn=1:4:5). The protection film 117 can be formed by a sputtering method. The thickness of the protection film 117 is preferably greater than or equal to 1 nm and less than or equal to 20 nm, or greater than or equal to 2 nm and less than or equal to 10 nm. In this embodiment, a 5-nm-thick indium tin oxide doped with silicon oxide (hereinafter referred to as ITSO) is used for the protection film 117.

Figure 10E:
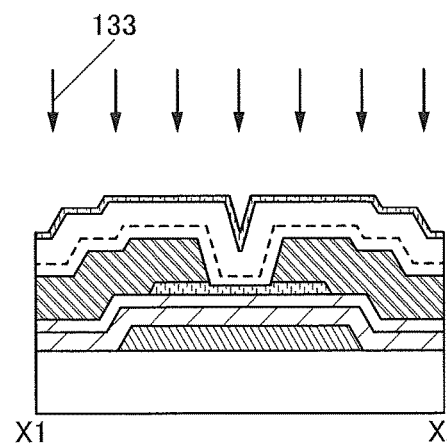
Figure 10F:
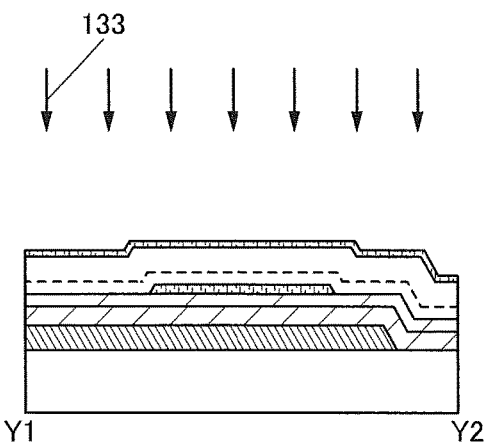

Next, oxygen 133 is added to the insulating films 114 and 116 and the oxide semiconductor film 108 through the protective film 117 (see FIGS. 10E and 10F).

As a method for adding the oxygen 133 to the insulating films 114 and 116 and the oxide semiconductor film 108 through the protective film 117, an ion doping method, an ion implantation method, plasma treatment, or the like is given. By the bias application to the substrate side when the oxygen 133 is added, the oxygen 133 can be effectively added to the insulating films 114 and 116 and the oxide semiconductor film 108. As the bias, for example, power density can be greater than or equal to 1 W/cm$^2$ and less than or equal to 5 W/cm$^2$. When the protective film 117 is provided over the insulating film 116 and then oxygen is added, the protective film 117 functions as a protective film for inhibiting release of oxygen from the insulating film 116. Thus, a larger amount of oxygen can be added to the insulating films 114 and 116 and the oxide semiconductor film 108.

In the case where oxygen is introduced by plasma treatment, excitation of oxygen with a microwave gives high density oxygen plasma, which contributes to the increase in the amount of oxygen introduced into the insulating films 114 and 116.

Figure 11A:
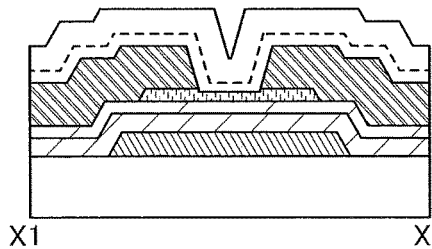
FIGS. 11A to 11H are cross-sectional views illustrating an example of a process of manufacturing a semiconductor device.
Figure 11B:
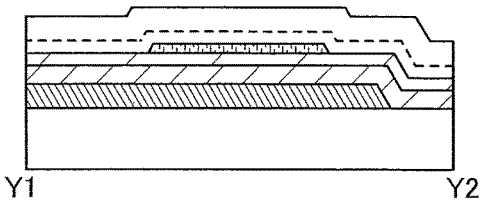

Next, the protection film 117 is removed (see FIGS. 11A and 11B).

A method for removing the protection film 117 is, for example, a dry etching method, a wet etching method, or a combination of a dry etching method and a wet etching method. In this embodiment, a wet etching method is employed for removing the protection film 117. Note that this embodiment shows an example in which the protection film 117 is removed, but one embodiment of the present invention is not limited to this. For example, the insulating film 118 may be formed over the protection film 117 without removing the protection film 117.

Figure 11C:
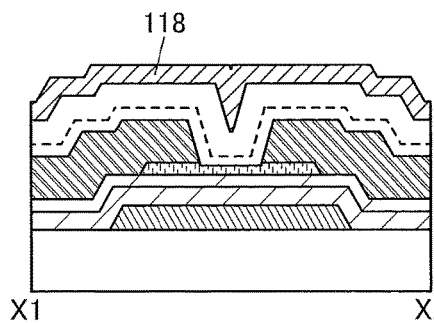
Figure 11D:
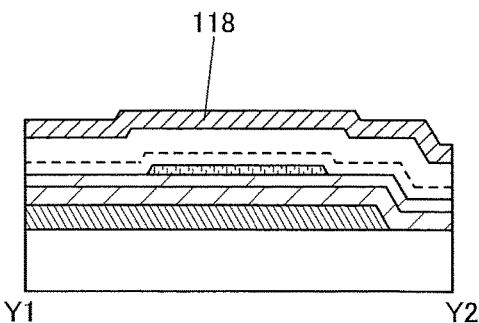
Figure 11E:
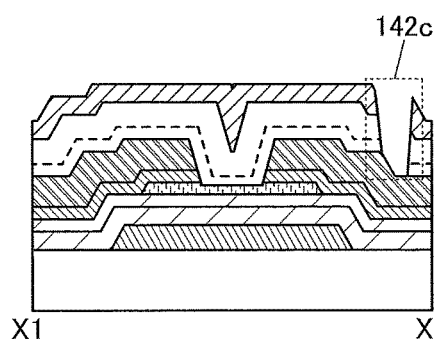

Next, the insulating film 118 is formed over the insulating film 116 (see FIGS. 11C and 11D).

Note that heat treatment may be performed before or after the formation of the insulating film 118, so that excess oxygen included in the insulating films 114 and 116 can be diffused to the oxide semiconductor film 108 to fill oxygen vacancy in the oxide semiconductor film 108. Alternatively, the insulating film 118 may be deposited while heating, so that excess oxygen included in the insulating films 114 and 116 can be diffused to the oxide semiconductor film 108 to fill oxygen vacancy in the oxide semiconductor film 108.

In the case where the insulating film 118 is formed by a PECVD method, the substrate temperature is preferably set to be higher than or equal to 300° C. and lower than or equal to 400° C., or further preferably higher than or equal to 320° C. and lower than or equal to 370° C., so that a dense film can be formed.

For example, in the case where a silicon nitride film is formed by a PECVD method as the insulating film 118, a deposition gas including silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which is included in a deposition gas including silicon and a triple bond between nitrogen molecules. As a result, the bond formation between silicon and nitrogen is promoted, leading to the formation of a dense silicon nitride film having few defects and negligible number of the bonds between silicon and hydrogen. On the other hand, when the amount of ammonia with respect to nitrogen is large, decomposition of a deposition gas including silicon and decomposition of nitrogen are not promoted, so that a sparse silicon nitride film in which bonds between silicon and hydrogen remain and defects are increased is formed. Therefore, as to the source gas, a flow rate ratio of the nitrogen to the ammonia is set to be greater than or equal to 5 and less than or equal to 50, or preferably greater than or equal to 10 and less than or equal to 50.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the supplied power corresponds to a power per unit area (power density) of $1.7 \times 10^{-1}$ W/cm$^2$.

Next, a mask is formed over the insulating film 118 through a lithography process, and the opening 142c is formed in a desired region in the insulating films 114, 116, and 118. In addition, a mask is formed over the insulating film 118 through a lithography process, and the openings 142a and 142b are formed in desired regions in the insulating films 106, 107, 114, 116, and 118. Note that the opening 142c reaches the conductive film 112b. The openings 142a and 142b reach the conductive film 104 (see FIGS. 11E and 11F).

Note that the openings 142a and 142b and the opening 142c may be formed in the same step or may be formed by different steps. In the case where the openings 142a and 142b and the opening 142c are formed in the same step, for example, a gray-tone mask or a half-tone mask can be used. Moreover, the openings 142a and 142b may be formed in a plurality of steps. For example, the insulating films 106 and 107 are processed and then the insulating films 114, 116, and 118 are formed and then processed.

Figure 11F:
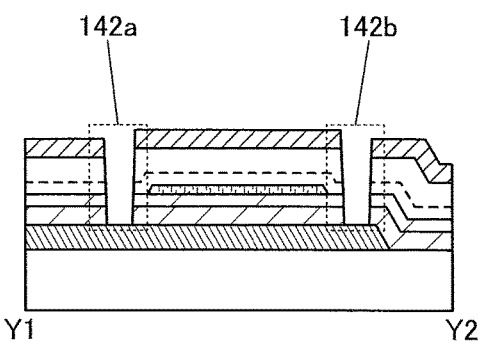
Figure 11G:
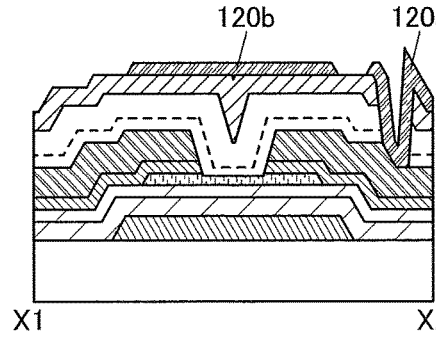
Figure 11H:
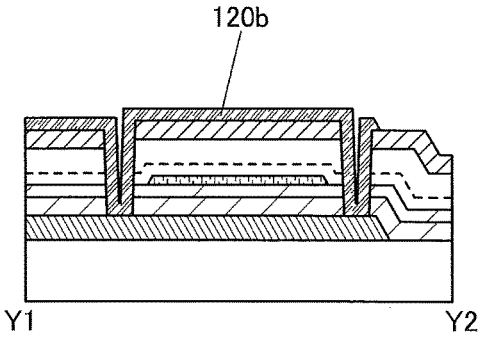

Next, a conductive film is formed over the insulating film 118 to cover the openings 142a, 142b, and 142c, and the conductive film is processed into a desired shape, so that the conductive films 120a and 120b are formed (see FIGS. 11G and 11H).

For the conductive films 120a and 120b, for example, a material including one of indium (In), zinc (Zn), and tin (Sn) can be used. In particular, for the conductive films 120a and 120b, a light-transmitting conductive material such as indium oxide including tungsten oxide, indium zinc oxide including tungsten oxide, indium oxide including titanium oxide, indium tin oxide including titanium oxide, ITO, indium zinc oxide, or ITSO can be used. In this embodiment, a 110-nm-thick ITSO film is formed by a sputtering method.

Through the above process, the transistor 100 illustrated in FIGS. 2A to 2C can be fabricated.

Note that the transistor 140 in FIGS. 3A to 3C and the transistor 160 in FIGS. 4A to 4C can be fabricated by changing shapes of masks for forming the openings 142a and 142b illustrated in FIG. 11F. The transistor 100A in FIGS. 5A and 5B, the transistor 140A in FIGS. 5C and 5D, and the transistor 160A in FIGS. 5E and 5F can be fabricated by forming the insulating film 122 over the conductive films 120a and 120b and the insulating film 118 after the steps in FIGS. 11G and 11H.

The structure and method described in this embodiment can be implemented in appropriate combination with any of the structures and methods described in the other embodiments.

Embodiment 2

In this embodiment, structures and properties of an oxide semiconductor included in a semiconductor device of one embodiment of the present invention is described in detail below.

<Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor (a-OS).

From another perspective, an oxide semiconductor is classified into an a-OS and a crystalline oxide semiconductor. In addition, examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a non-fixed bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor film that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

A CAAC-OS is one of oxide semiconductors having a plurality of c-axis aligned crystal parts (also referred to as pellets).

In a combined analysis image (also referred to as a high-resolution transmission electron microscope (IBM) image of a bright-field image and a diffraction pattern of a CAAC-OS, which is obtained using a TEM, a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 12A:
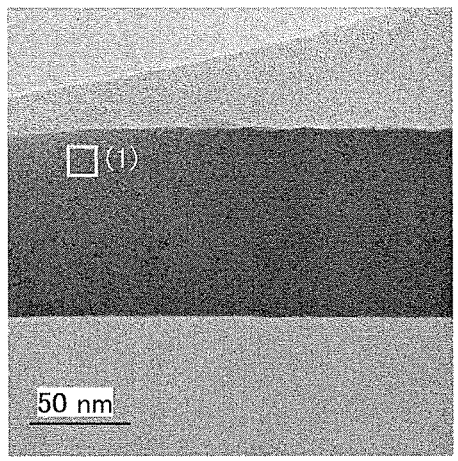
FIGS. 12A to 12C are Cs-corrected high-resolution TEM images of a cross section of a CAAC-OS.

The CAAC-OS observed with a TEM is described below. FIG. 12A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 12B:
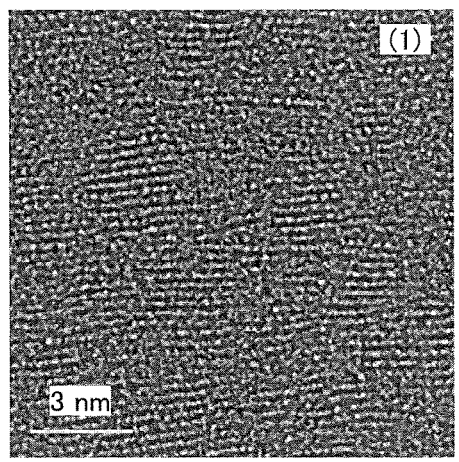

FIG. 12B is an enlarged Cs-corrected high-resolution TEM image of a region (1) in FIG. 12A. FIG. 12B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS, and is arranged parallel to the formation surface or the top surface of the CAAC-OS.

Figure 12C:
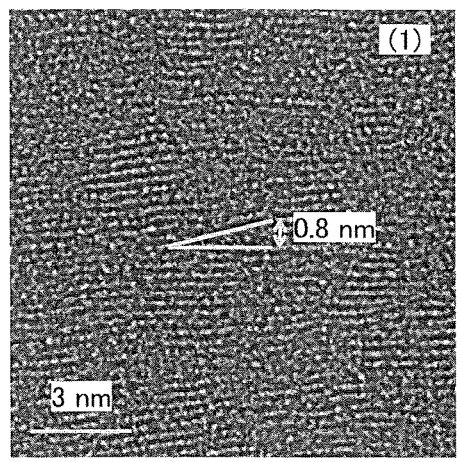

As shown in FIG. 12B, the CAAC-OS has a characteristic atomic arrangement. The characteristic atomic arrangement is denoted by an auxiliary line in FIG. 12C. FIGS. 12B and 12C prove that the size of a pellet is greater than or equal to 1 nm or greater than or equal to 3 nm, and the space between the pellets caused by the tilt is approximately 0.8 nm. Therefore, the pellet can also be referred to as a nanocrystal (nc). Furthermore, a CAAC-OS can be referred to as an oxide semiconductor including c-axis aligned nanocrystals (CANC).

Figure 12D:
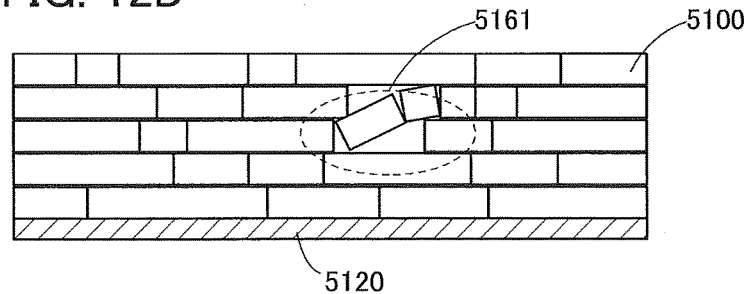
FIG. 12D is a cross-sectional schematic view of the CAAC-OS.

Here, according to the Cs-corrected high-resolution TEM images, the schematic arrangement of pellets 5100 of a CAAC-OS over a substrate 5120 is illustrated by such a structure in which bricks or blocks are stacked (see FIG. 12D). The part in which the pellets are tilted as observed in FIG. 12C corresponds to a region 5161 illustrated in FIG. 12D.

Figure 13A:
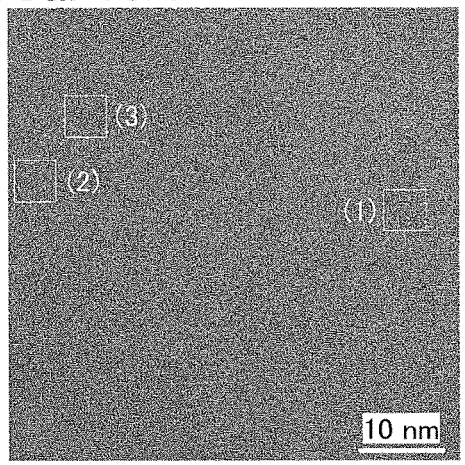
FIGS. 13A to 13D are Cs-corrected high-resolution TEM images of a plane of a CAAC-OS.
Figure 13B:
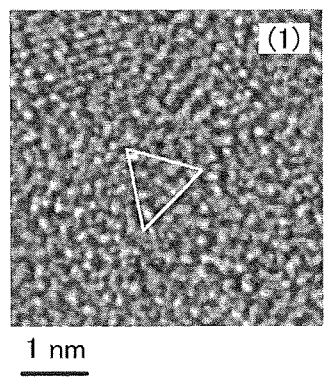
Figure 13C:
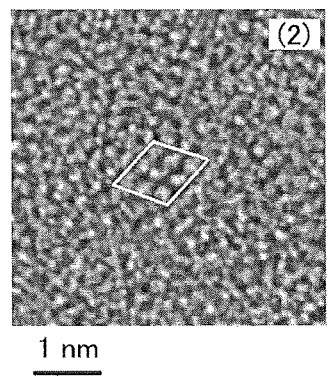
Figure 13D:
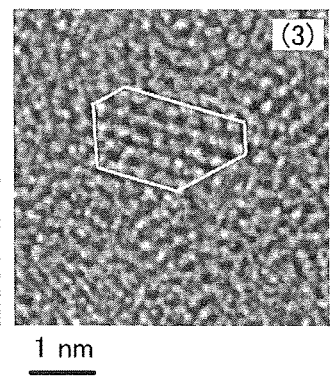

FIG. 13A shows a Cs-corrected high-resolution TEM image of a plane of the CAAC-OS observed from a direction substantially perpendicular to the sample surface. FIGS. 13B, 13C, and 13D are enlarged Cs-corrected high-resolution TEM images of regions (1), (2), and (3) in FIG. 13A, respectively. FIGS. 13B, 13C, and 13D indicate that metal atoms are arranged in a triangular, quadrangular, or hexagonal configuration in a pellet. However, there is no regularity of arrangement of metal atoms between different pellets.

Figure 14A:
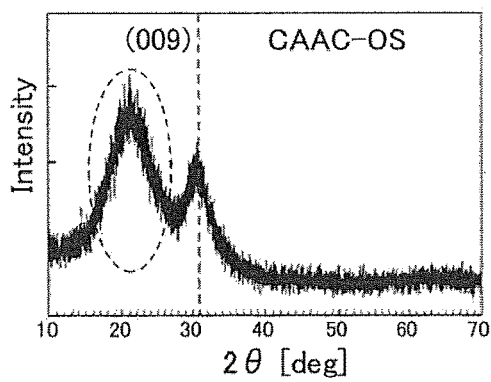
FIGS. 14A to 14C show structural analysis data of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of 31° as shown in FIG. 14A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is 36°, in addition to the peak at 2θ of 31°. The peak of 2θ at 36° indicates that a crystal having no c-axis alignment is included in part of the CAAC-OS. A highly c-axis aligned CAAC-OS shows a peak at 2θ of 31° but does not give a peak at 2θ of 36° in the analysis by the out-of-plane method.

Figure 14B:
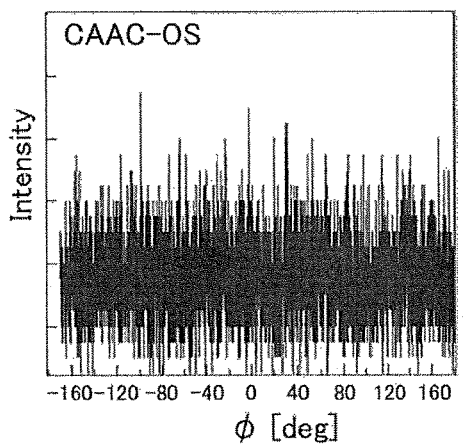
Figure 14C:
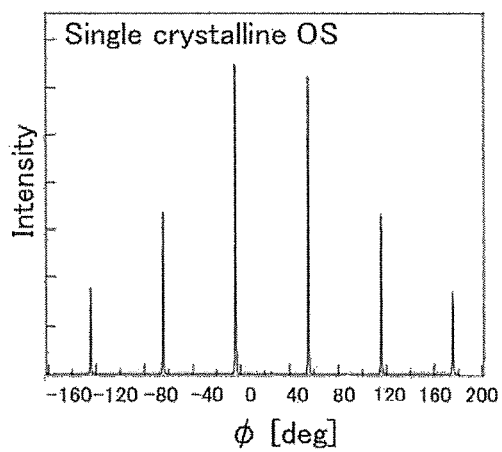

On the other hand, in structural analysis of the CAAC-OS by an in-plane method in which an X-ray is incident on a sample in a direction substantially perpendicular to the c-axis, a peak appears when 2θ is 56°. This peak is derived from the (110) plane of the InGaZnO$_4$ crystal. In the case of the CAAC-OS, when analysis (φ scan) is performed with 2θ fixed at 56° and with the sample rotated about a normal vector of the sample surface as an axis (φ axis), as shown in FIG. 14B, a peak is not clearly observed. In contrast, in the case of a single crystal oxide semiconductor of InGaZnO$_4$, when φ scan is performed with 2θ fixed at 56°, as shown in FIG. 14C, six peaks which are derived from crystal planes equivalent to the (110) plane are observed. Accordingly, the structural analysis using XRD shows that the directions of a-axes and b-axes are irregularly oriented in the CAAC-OS.

Figure 15A:
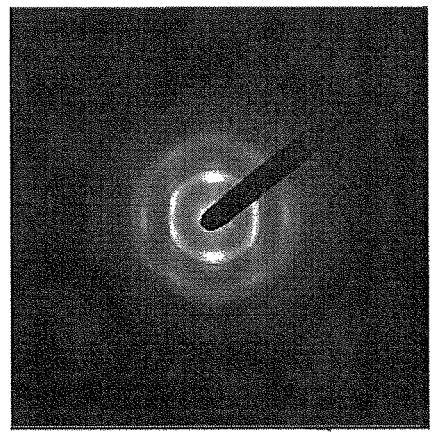
FIGS. 15A and 15B show electron diffraction patterns of a CAAC-OS.
Figure 15B:
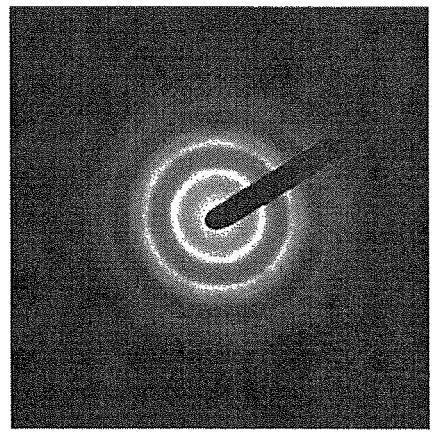

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 15A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 15B shows a diffraction pattern obtained in such a manner that an electron beam with a probe diameter of 300 nm is incident on the same sample in a direction perpendicular to the sample surface. As shown in FIG. 15B, a ring-like diffraction pattern is observed. Thus, the electron diffraction also indicates that the a-axes and b-axes of the pellets included in the CAAC-OS do not have regular orientation. The first ring in FIG. 15B is considered to be derived from the (010) plane, the (100) plane, and the like of the InGaZnO$_4$ crystal. Furthermore, it is supposed that the second ring in FIG. 15B is derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancy).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor serves as carrier traps or carrier generation sources, for example. Furthermore, oxygen vacancy in the oxide semiconductor might serve as a carrier trap or a carrier generation source when hydrogen is captured therein.

Thus, the CAAC-OS having small amounts of impurities and oxygen vacancy has a very low carrier density (specifically, lower than $8 \times 10^{11}/cm^3$, preferably lower than $1 \times 10^{11}/cm^3$, or further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a crystal grain boundary is not clearly observed in some cases. The crystal part of the nanocrystal can be considered to correspond to the pellet in a CAAC-OS. Therefore, a crystal part of the nc-OS may be referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, any crystal orientation is not observed in the whole film. Accordingly, the nc-OS cannot be distinguished from an a-like OS and an a-OS, depending on an analysis method. For example, when the nc-OS is analyzed by an out-of-plane method using an X-ray beam having a diameter larger than the size of a pellet, a peak which shows a crystal plane cannot be detected. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is used. Moreover, in a nanobeam electron diffraction pattern of the nc-OS, a plurality of circumferentially distributed spots can be observed. Also in a nanobeam electron diffraction pattern of the nc-OS layer, a plurality of spots can be observed in a ring-like region.

Since there is no regularity of crystal orientation between the pellets (nanocrystals) as mentioned above, the nc-OS can also be referred to as an oxide semiconductor including randomly aligned nanocrystals (RANC) or an oxide semiconductor including non-aligned nanocrystals (NANC).

The nc-OS is an oxide semiconductor that has high regularity as compared with an a-OS. Therefore, the nc-OS is likely to have a lower density of defect states than an a-like OS and an a-OS. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the a-OS.

In a high-resolution TEM image of the a-like OS, a void can be observed. Furthermore, in the high-resolution TEM image, there are a region where a crystal part is clearly observed and a region where a crystal part is not observed.

Figure 16:
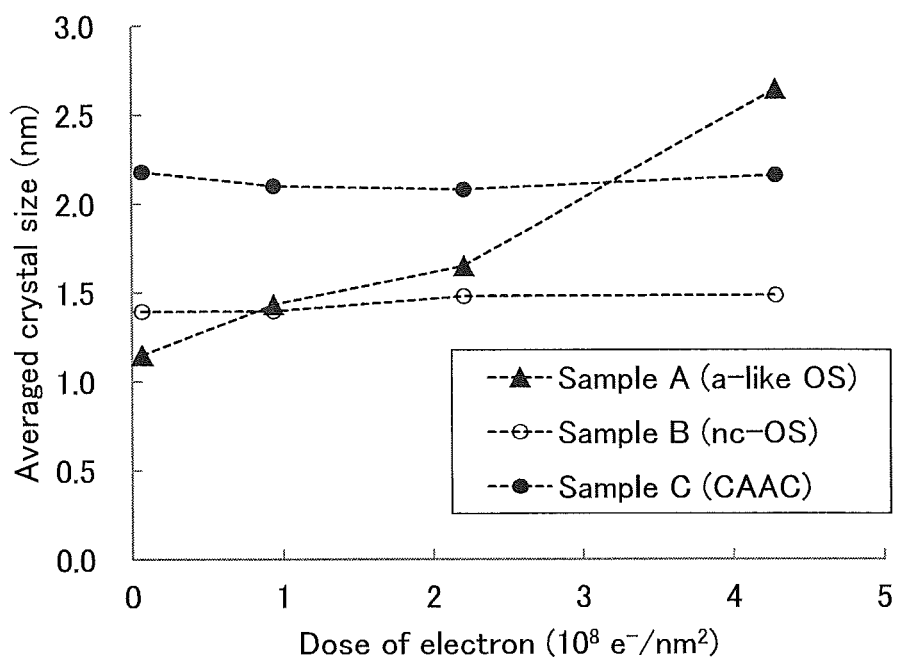
FIG. 16 shows a change in a crystal part of an In—Ga—Zn oxide induced by electron irradiation.

The a-like OS has an unstable structure compared with the nc-OS and the CAAC-OS because it contains a void. For example, the a-like OS changes in morphology upon electron irradiation. Specifically, as shown in FIG. 16, the electron-beam irradiation on the a-like OS of an In—Ga—Zn oxide (sample A) results in increase in the averaged crystal size of the crystal part, estimated by a high-resolution cross-sectional TEM, with increasing amount of electron dose. In contrast, in the case of nc-OS (sample B) and CAAC-OS (sample C) of the same oxide, no marked change is observed upon electron-beam irradiation.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

The structure described in this embodiment can be implemented in appropriate combination with any of the structures described in the other embodiments.

Embodiment 3

In this embodiment, an example of a display device that includes any of the transistors described in the embodiment above is described below with reference to FIG. 17, FIG. 18, and FIG. 19.

Figure 17:
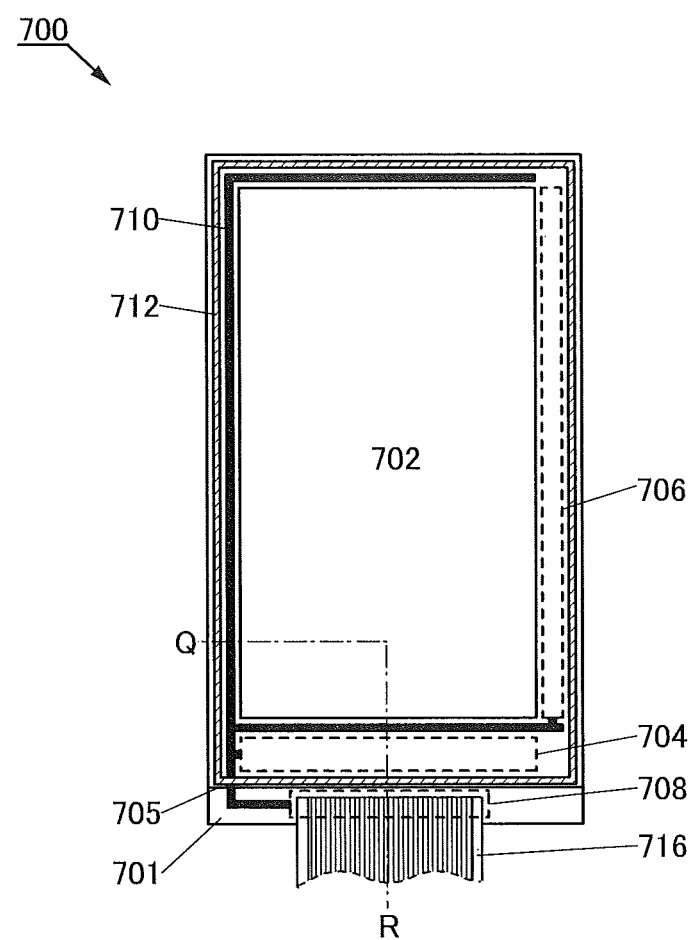
FIG. 17 is a top view illustrating one embodiment of a display device.

FIG. 17 is a top view of an example of a display device. A display device 700 illustrated in FIG. 17 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 17, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. An FPC 716 is connected to the FPC terminal portion 708, and a variety of signals and the like are supplied to the pixel portion 702, the source driver circuit portion 704, and the gate driver circuit portion 706 through the FPC 716. A signal line 710 is connected to the pixel portion 702, the source driver circuit portion 704, the gate driver circuit portion 706, and the FPC terminal portion 708. Various signals and the like are applied to the pixel portion 702, the source driver circuit portion 704, and the gate driver circuit portion 706 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method for connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of various elements. Examples of the elements are electroluminescent (EL) element (e.g., an EL element including organic and inorganic materials, an organic EL element, an inorganic EL element, an LED), a light-emitting transistor (a transistor which emits light by current), an electron emitter, a liquid crystal element, an electronic ink display element, an electrophoretic element, an electrowetting element, a plasma display (PDP) element, a micro electro mechanical system (MEMS) display element (e.g., a grating light valve (GLV), a digital micromirror device (DMD), a digital micro shutter (DMS) element, an interferometric modulator display (IMOD) element, and the like), or a piezoelectric ceramic display, which has a display media whose contrast, luminance, reflectivity, transmittance, or the like is changed by electromagnetic action. Examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared with the case of using the coloring layer in some cases.

In this embodiment, a structure including a liquid crystal element or an EL element as a display element is described with reference to FIG. 18 and FIG. 19. Note that FIG. 18 is a cross-sectional view taken along the dashed line Q-R in FIG. 17, and shows a structure including a liquid crystal element as a display element. FIG. 19 is a cross-sectional view taken along the dashed line Q-R in FIG. 17, and shows a structure including an EL element as a display element.

Figure 18:
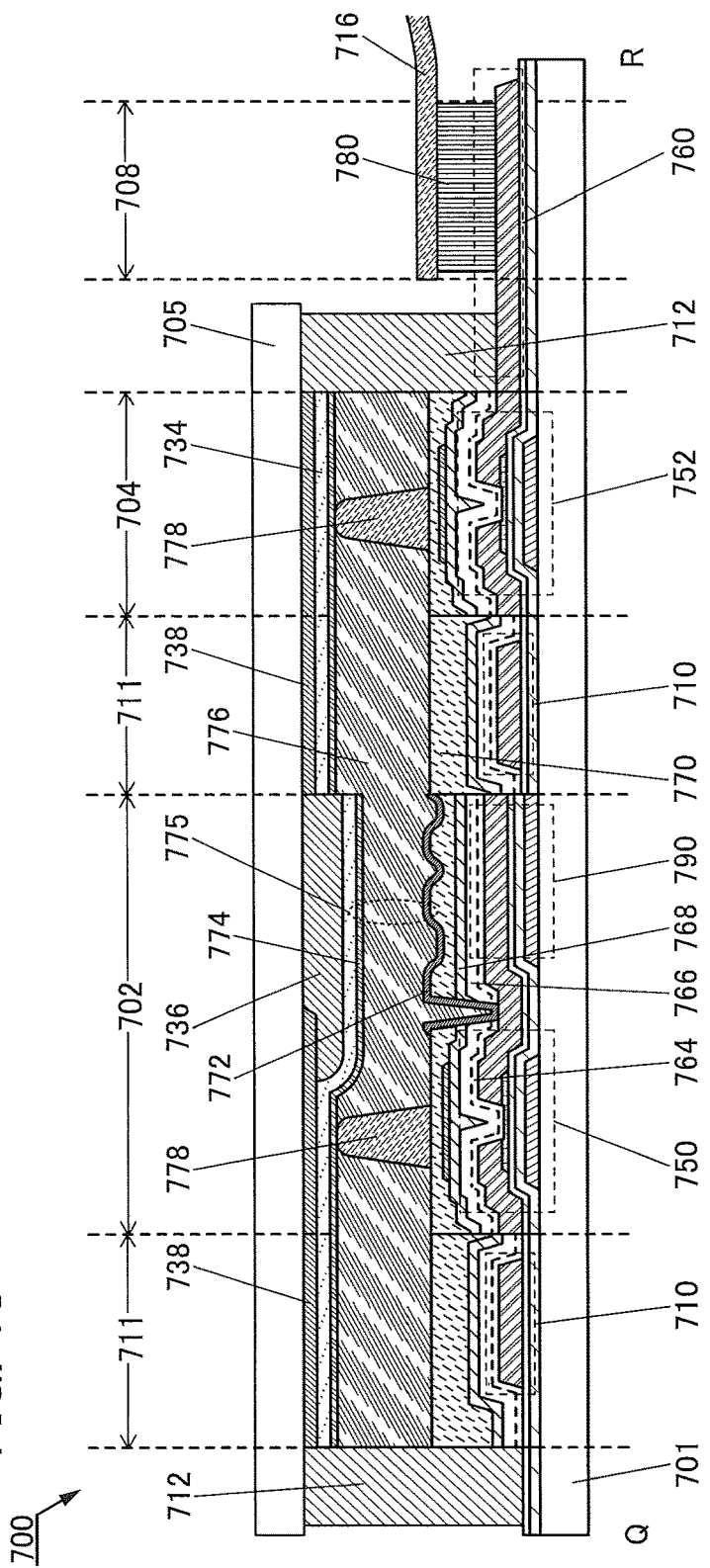
FIG. 18 is a cross-sectional view illustrating one embodiment of a display device.
Figure 19:
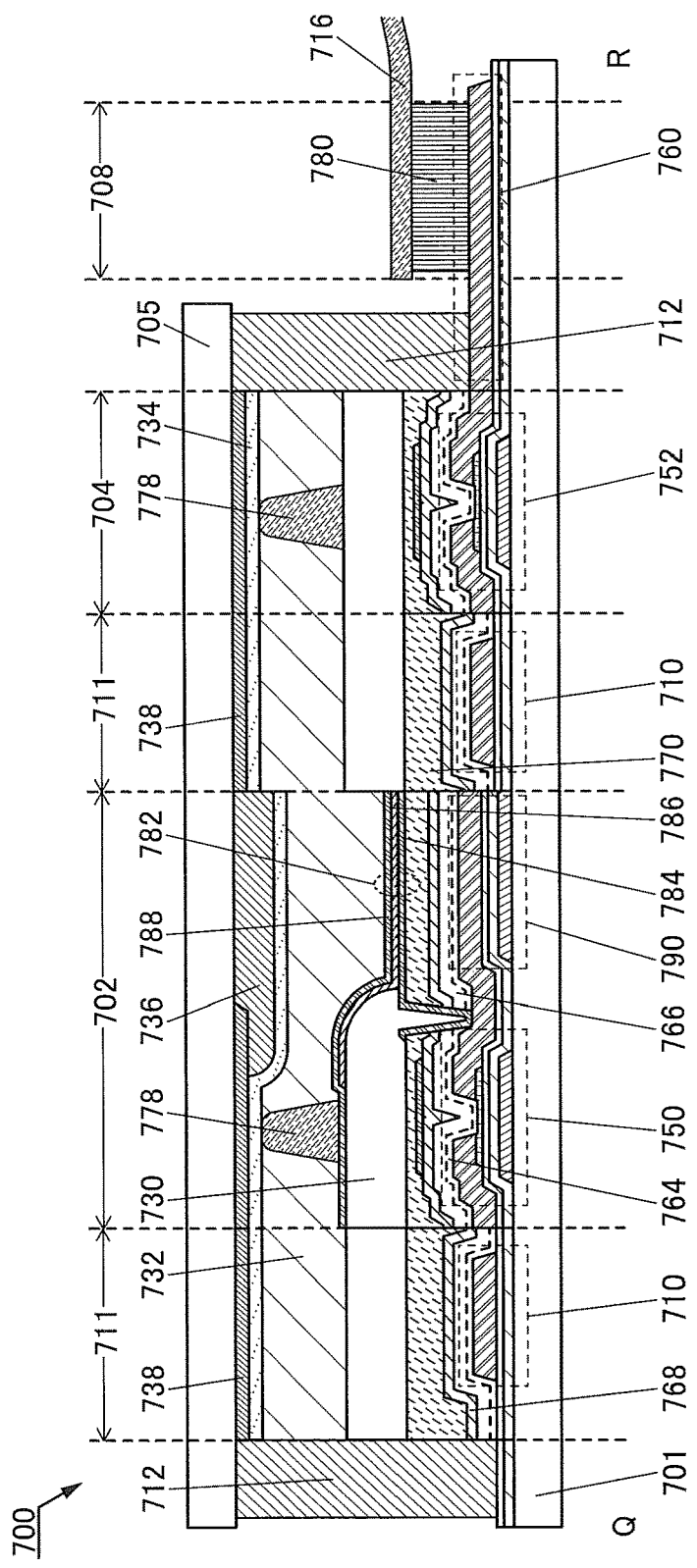
FIG. 19 is a cross-sectional view illustrating one embodiment of a display device.

Common portions between FIG. 18 and FIG. 19 are described first, and then different portions are described.

<Common Portions in Display Devices>

The display device 700 illustrated in FIG. 18 and FIG. 19 include a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of oxygen vacancy is suppressed. In the transistor, the current in an off state (off-state current) can be made small. Accordingly, an electrical signal such as an image signal can be held for a longer period, and a writing interval can be set longer. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, whereby the number of components of the semiconductor device can be reduced. The transistor which can operate at high speed can be used also in the pixel portion, whereby a high-quality image can be provided.

The capacitor 790 includes a dielectric between a pair of electrodes. Specifically, a conductive film which is formed using the same step as a conductive film that functions as a gate electrode of the transistor 750 is used as one electrode of the capacitor 790, and a conductive film that functions as a source electrode or a drain electrode of the transistor 750 is used as the other electrode of the capacitor 790. An insulating film that functions as a gate insulating film of the transistor 750 is used as the dielectric between the pair of electrodes.

In FIG. 18 and FIG. 19, insulating films 764, 766, and 768 and a planarization insulating film 770 are formed over the transistor 750, the transistor 752, and the capacitor 790.

The insulating films 764, 766, and 768 can be formed using materials and methods similar to those of the insulating films 114, 116, and 118 described in the above embodiment, respectively. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same steps as conductive films which function as source and drain electrodes of the transistor 750 or 752. Note that the signal line 710 may be formed using a conductive film which is formed in different steps as a source electrode and a drain electrode of the transistor 750 or 752, for example, a conductive film that functions as a gate electrode may be used. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same steps as conductive films which function as source and drain electrodes of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the first substrate 701 side is described as an example in this embodiment, one embodiment of the present invention is not limited thereto. For example, a structure in which the structure body 778 is provided on the second substrate 705 side, or a structure in which both of the first substrate 701 and the second substrate 705 are provided with the structure body 778 may be employed.

A light-blocking film 738 that functions as a black matrix, a coloring film 736 that functions as a color filter, and an insulating film 734 in contact with the light-blocking film 738 and the coloring film 736 are provided on the second substrate 705 side.

<Structure Example of Display Device Using Liquid Crystal Element as Display Element>

The display device 700 in FIG. 18 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 18 is capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive film that functions as a source electrode and a drain electrode included in the transistor 750. The conductive film 772 is formed over the planarization insulating film 770 to function as a pixel electrode, i.e., one electrode of the display element. The conductive film 772 functions as a reflective electrode. The display device 700 in FIG. 18 is what is called a reflective color liquid crystal display device in which external light is reflected by the conductive film 772 to display an image through the coloring film 736.

A conductive film that transmits visible light or a conductive film that reflects visible light can be used as the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used as the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film (here, the planarization insulating film 770) and the conductive film 772 can be improved.

(2) The aluminum film and the silver alloy film can be collectively etched depending on an etchant.

(3) The conductive film 772 can have a favorable cross-sectional shape (e.g., a tapered shape).

The reason for (3) is as follows: the etching rate of the aluminum film can be lower than that of the silver alloy film by appropriately selecting an etchant, or etching of the aluminum film is developed faster than that of the silver alloy film because, when the aluminum film is exposed by the etching of the silver alloy film, electrons are abstracted from metal that is less noble than the silver alloy film, i.e., aluminum having a higher ionization tendency, and thus etching of the silver alloy film is suppressed.

Note that projections and depressions are provided in part of the planarization insulating film 770 of the pixel portion 702 in the display device 700 in FIG. 18. The planarization insulating film 770 can be formed using a resin or the like. The conductive film 772 that functions as a reflective electrode is formed along the projections and depressions. Therefore, when external light is incident on the conductive film 772, the light is reflected diffusely at the surface of the conductive film 772, whereby visibility can be improved.

Note that the display device 700 in FIG. 18 is a reflective color liquid crystal display device given as an example, but a display type is not limited thereto. For example, a transmissive color liquid crystal display device in which the conductive film 772 that transmits visible light may be used. In the case of a transmissive color liquid crystal display device, projections and depressions are not necessarily provided on the planarization insulating film 770.

Although not illustrated in FIG. 18, an alignment film may be provided on a side of the conductive film 772 and on a side of the conductive film 774 so as to be in contact with the liquid crystal layer 776. Although not illustrated in FIG. 18, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

As the liquid crystal layer 776, a thermotropic liquid crystal, a ferroelectric liquid crystal, an anti-ferroelectric liquid crystal, or the like can be used. The liquid crystal can be a low molecular-weight molecule, a high molecular-weight molecule, or a polymer dispersed liquid crystal. Such a liquid crystal material exhibits a cholesteric phase, a smectic phase, a cubic phase, a chiral nematic phase, an isotropic phase, or the like depending on conditions.

In the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent of a chiral material is mixed is used for the liquid crystal layer in order to improve the temperature range. The liquid crystal composition which includes liquid crystal exhibiting a blue phase and a chiral material has a short response time, and does not require the alignment process. In addition, the liquid crystal element including the liquid crystal composition which includes liquid crystal exhibiting a blue phase has a small viewing angle dependence. An alignment film is not necessary and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, or an advanced super view (ASV) mode can be employed.

<Display Device Using Light-Emitting Element as Display Element>

The display device 700 illustrated in FIG. 19 includes a light-emitting element 782. The light-emitting element 782 includes a conductive film 784, an EL layer 786, and a conductive film 788. The display device 700 in FIG. 19 is capable of displaying an image by light emission from the EL layer 786 included in the light-emitting element 782.

The conductive film 784 is connected to the conductive film that functions as a source electrode and a drain electrode included in the transistor 750. The conductive film 784 is formed over the planarization insulating film 770 to function as a pixel electrode, i.e., one electrode of the display element. A conductive film which transmits visible light or a conductive film which reflects visible light can be used as the conductive film 784. The conductive film which transmits visible light can be formed using a material including one kind selected from indium (In), zinc (Zn), and tin (Sn), for example. The conductive film which reflects visible light can be formed using a material including aluminum or silver, for example.

In the display device 700 in FIG. 19, an insulating film 730 is provided over the planarization insulating film 770 and the conductive film 784. The insulating film 730 covers part of the conductive film 784. The light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 in FIG. 19, the structure is not limited thereto. In the case where the EL layer 786 is formed by a separate coloring method, the coloring film 736 is not necessarily provided.

The structure described in this embodiment can be used in appropriate combination with any of the structures described in the other embodiments.

Embodiment 4

In this embodiment, a display device that includes a semiconductor device of one embodiment of the present invention is described with reference to FIGS. 20A to 20C.

The display device illustrated in FIG. 20A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed, in which case the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches, for example. The source driver 504b can output, as the data signals, signals obtained by time-dividing the video signal by sequentially turning on the plurality of analog switches.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (in is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 20A:
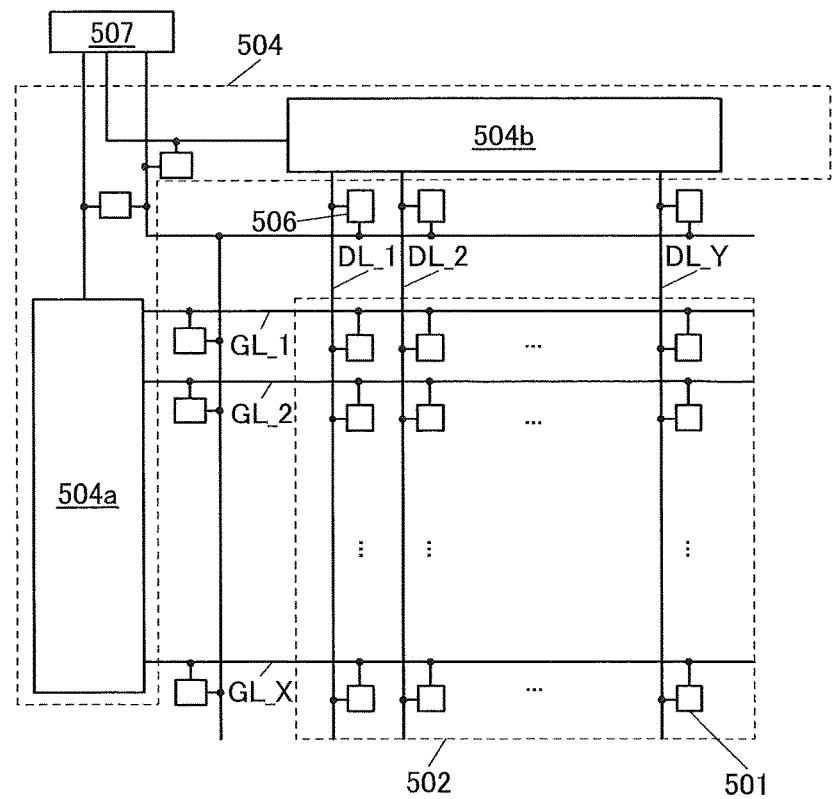
FIGS. 20A to 20C are a block diagram and circuit diagrams illustrating a display device.

The protection circuit 506 illustrated in FIG. 20A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 20A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 20A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a poly-crystalline semiconductor film) may be mounted.

Figure 20B:
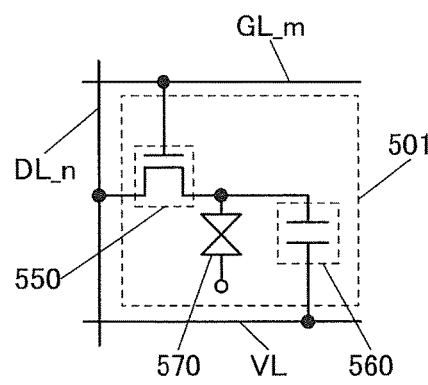

Each of the plurality of pixel circuits 501 in FIG. 20A can have the structure illustrated in FIG. 20B, for example.

The pixel circuit 501 illustrated in FIG. 20B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. The potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, a super-twisted nematic (STN) mode, a VA mode, an ASM mode, an OCB mode, an FLC mode, an AFLC mode, an MVA mode, a PVA mode, an IPS mode, an FFS mode, a transverse bend alignment (TBA) mode, and the like. Other examples of the driving method of the display device include an electrically controlled birefringence (ECB) mode, a polymer-dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling data writing by switching between on and off states.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

In the display device including the pixel circuit 501 in FIG. 20B, the pixel circuits 501 are sequentially selected row by row by the gate driver 504a illustrated in FIG. 20A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 20C:
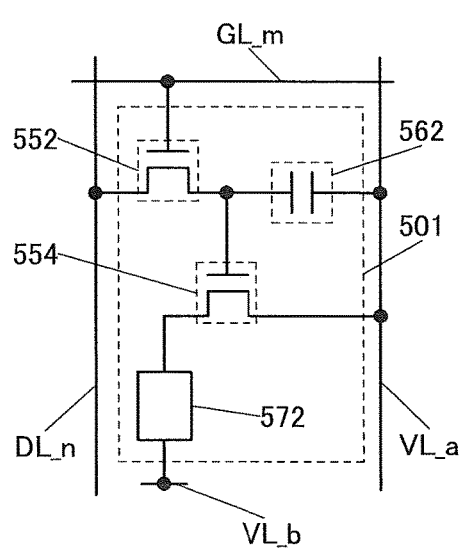

Alternatively, each of the plurality of pixel circuits 501 in FIG. 20A can have the structure illustrated in FIG. 20C, for example.

The pixel circuit 501 illustrated in FIG. 20C includes transistors 552 and 554, a capacitor 562, and a light-emitting element 572. Any of the transistors described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling writing of data from a data signal by switching between on and off states.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 20C, the pixel circuits 501 are sequentially selected row by row by the gate driver 504a illustrated in FIG. 20A, whereby the transistors 552 are turned on and a data signal is written.

When the transistors 552 are turned off, the pixel circuits 501 in which the data has been written are brought into a holding state. The amount of current flowing between the source electrode and the drain electrode of the transistor 554 is controlled in accordance with the potential of the written data signal. The light-emitting element 572 emits light with luminance corresponding to the amount of flowing current. This operation is sequentially performed row by row; thus, an image can be displayed.

The structure described in this embodiment can be used in appropriate combination with the structure described in any of the other embodiments.

Embodiment 5

In this embodiment, a display module and electronic appliances that include a semiconductor device of one embodiment of the present invention is described with reference to FIG. 21 and FIGS. 22A to 22G.

Figure 21:
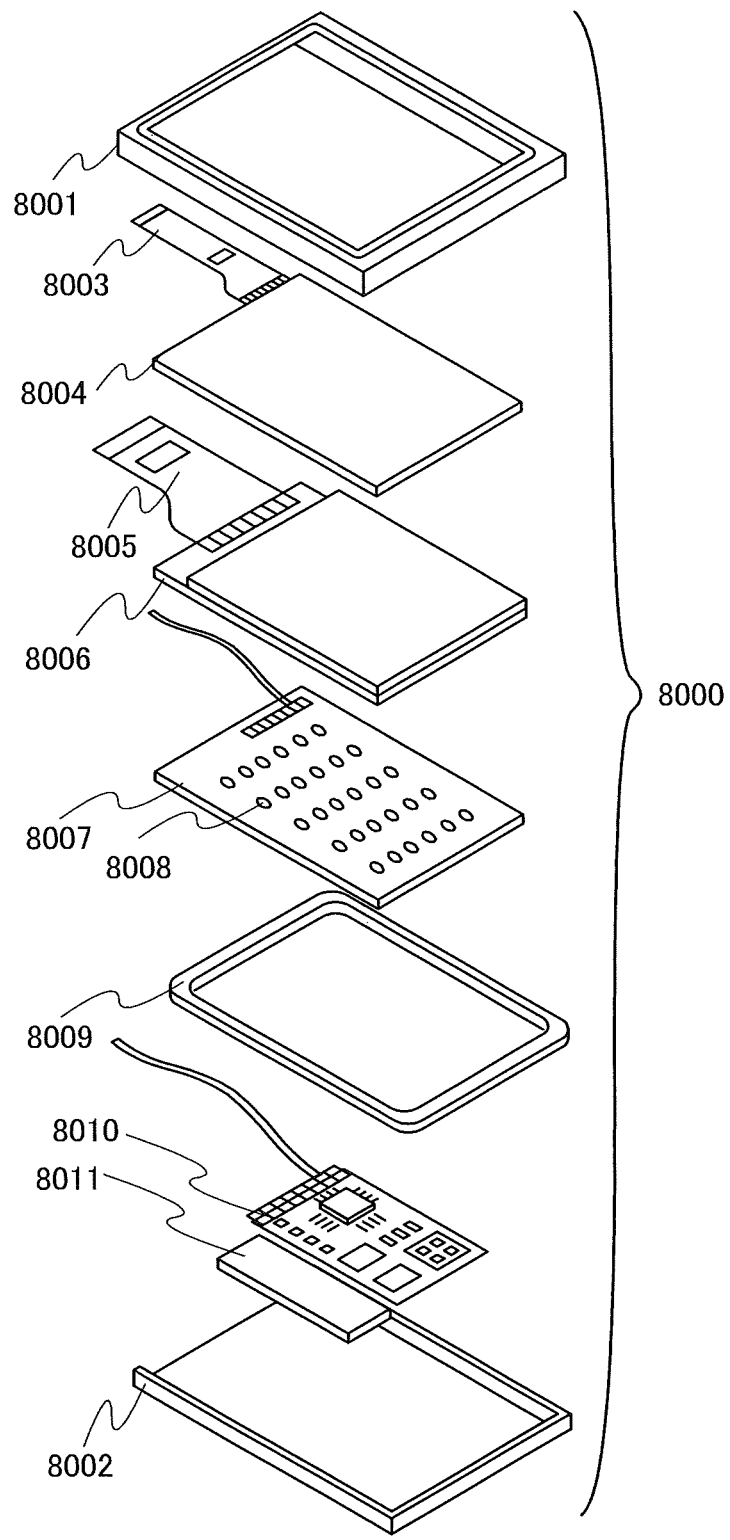
FIG. 21 illustrates a display module.

In a display module 8000 illustrated in FIG. 21, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Although a structure in which the light sources 8008 are provided over the backlight 8007 is illustrated in FIG. 21, one embodiment of the present invention is not limited to this structure. For example, a structure in which the light source 8008 is provided at an end portion of the backlight 8007 and a light diffusion plate is further provided may be employed. The backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 22A to 22G illustrate electronic appliances. These electronic appliances can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic appliances illustrated in FIGS. 22A to 22G can have a variety of functions. Examples of the functions are a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on the display portion. Note that functions that can be provided for the electronic appliances illustrated in FIGS. 22A to 22G are not limited to those described above, and the electronic appliances can have a variety of functions. Although not illustrated in FIGS. 22A to 22G, the electronic appliance may include a plurality of display portions. Furthermore, the electronic appliance may be provided with a camera and the like and have a function of taking a still image, a function of taking a moving image, a function of storing a shot image in a memory medium (an external memory medium or a memory medium incorporated in the camera), a function of displaying a shot image on the display portion, or the like.

The electronic appliances illustrated in FIGS. 22A to 22G are described in detail below.

Figure 22A:
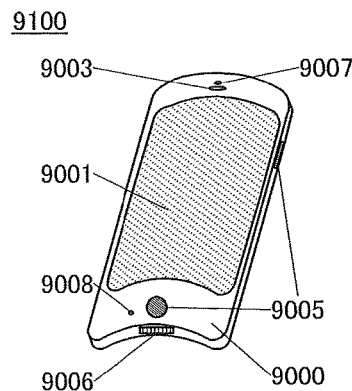
FIGS. 22A to 22G illustrate electronic appliances.

FIG. 22A is a perspective view illustrating a portable information terminal 9100. A display portion 9001 of the portable information terminal 9100 is flexible. Therefore, the display portion 9001 can be incorporated along a bent surface of a bent housing 9000. The display portion 9001 includes a touch sensor, and operation can be performed by touching the screen with a finger, a stylus, or the like. For example, by touching an icon displayed on the display portion 9001, application can be started.

Figure 22D:
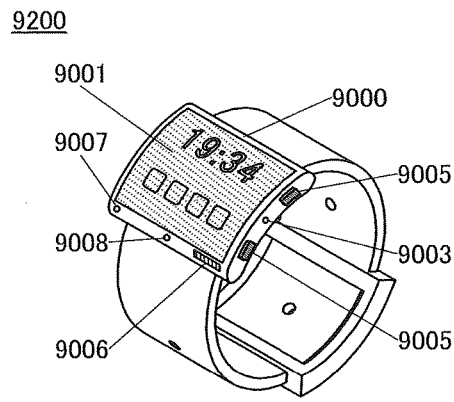
Figure 22B:
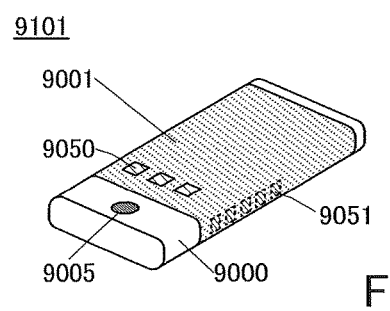

FIG. 22B is a perspective view illustrating a portable information terminal 9101. The portable information terminal 9101 functions as, for example, one or more of a telephone set, a notebook, and an information browsing system. Specifically, the portable information terminal 9101 can be used as a smartphone. Note that although the speaker 9003, the connection terminal 9006, the sensor 9007, and the like are not illustrated in FIG. 22B, they can be provided in the same positions as the portable information terminal 9100 in FIG. 22A. The portable information terminal 9101 can display characters and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and SNS massage; the date; the time; remaining battery; and the reception strength of an antenna. Alternatively, the operation buttons 9050 or the like may be displayed in place of the information 9051.

Figure 22E:
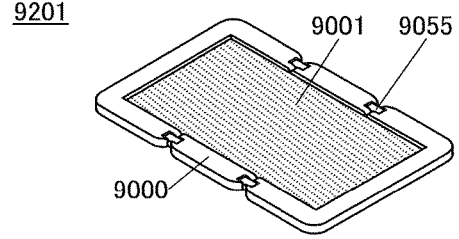
Figure 22C:
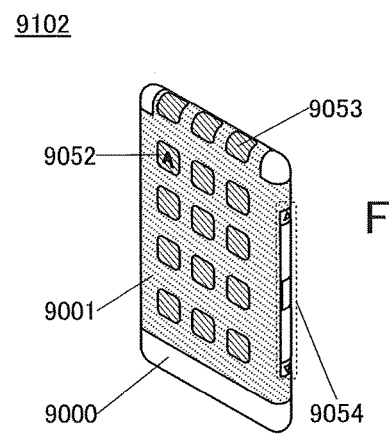

FIG. 22C is a perspective view illustrating a portable information terminal 9102. The portable information terminal 9102 has a function of displaying information, for example, on three or more sides of the display portion 9001. Here, information 9052, information 9053, and information 9054 are displayed on different sides. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 22D is a perspective view illustrating a wrist-watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. Moreover, the portable information terminal 9200 includes the connection terminal 9006, and data can be directly transmitted to and received from another information terminal via a connector. Charging through the connection terminal 9006 is possible. Note that the charging operation may be performed by wireless power feeding without using the connection terminal 9006.

Figure 22F:
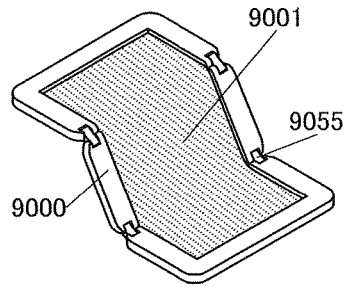
Figure 22G:
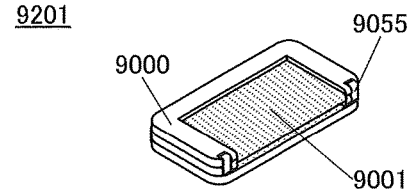
Figure 23:
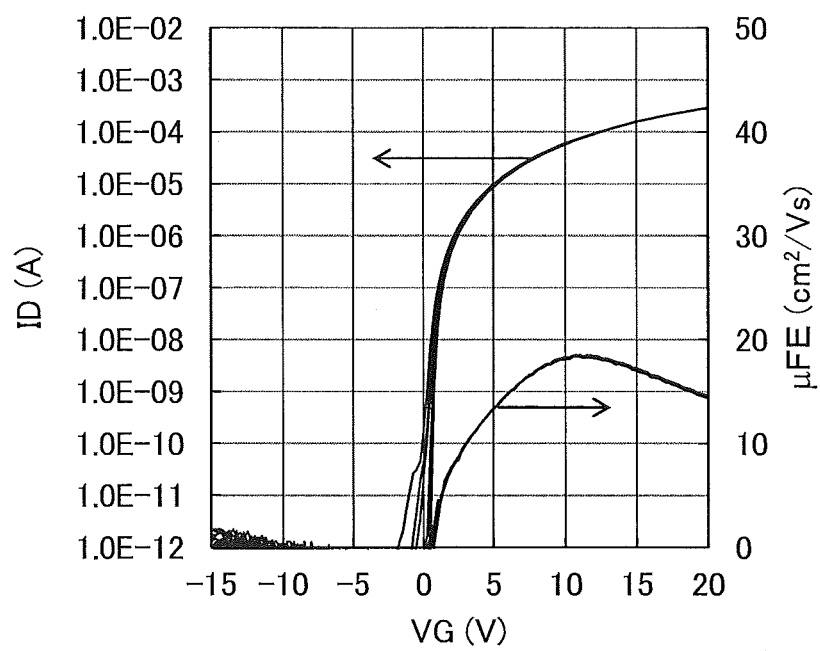
FIG. 23 shows the ID-VG characteristics of a transistor under light irradiation.
Figure 24:
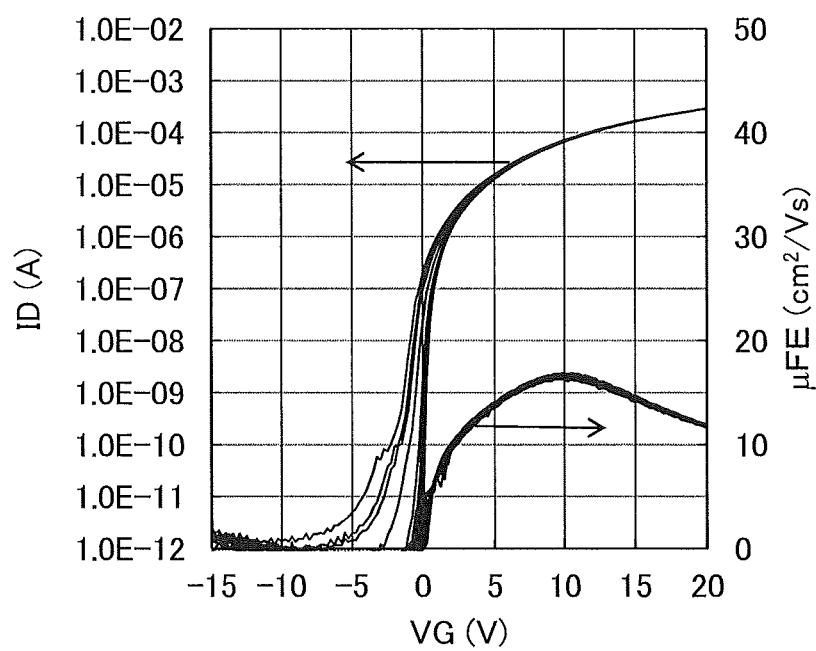
FIG. 24 shows the ID-VG characteristics of a transistor under light irradiation.
Figure 25:
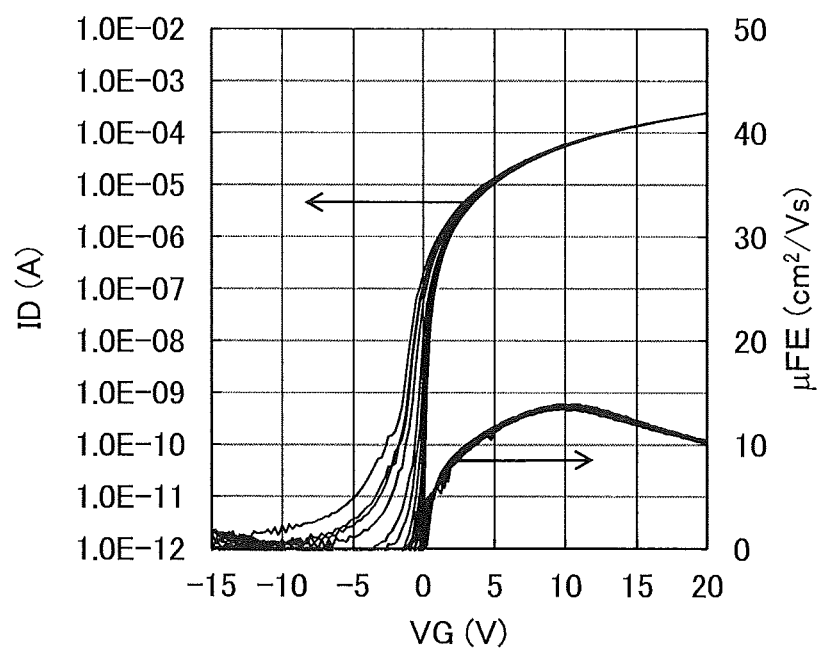
FIG. 25 shows the ID-VG characteristics of a transistor under light irradiation.
Figure 26:
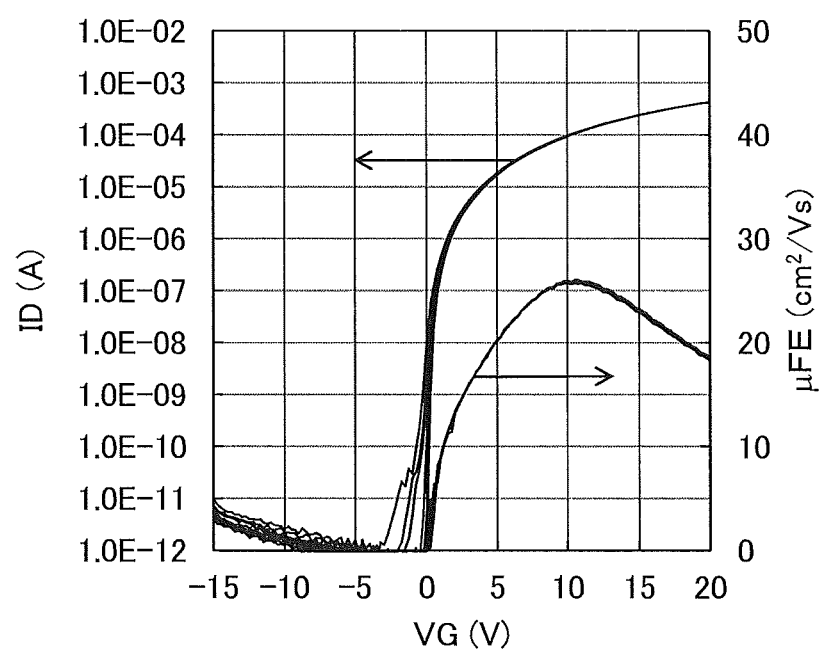
FIG. 26 shows the ID-VG characteristics of a transistor under light irradiation.

FIGS. 22E, 22F, and 22G are perspective views each illustrating a foldable portable information terminal 9201. FIG. 22E is a perspective view illustrating the portable information terminal 9201 that is opened, FIG. 22F is a perspective view illustrating the portable information terminal 9201 that is being opened or being folded, and FIG. 22G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic appliances described in this embodiment each include the display portion for displaying some sort of data. Note that the semiconductor device of one embodiment of the present invention can also be used for an electronic appliance that does not have a display portion. The display portion of the electronic appliance described in this embodiment as an example is flexible so that display can be performed on the bent display surface or the display portion can be folded. However, the structure is not limited thereto and the display portion of the electronic appliance may not be flexible and display may be performed on a plane portion.

The structure described in this embodiment can be used in appropriate combination with any of the structures described in the other embodiments.

Example

In this example, a transistor corresponding to the transistor 100 illustrated in FIGS. 2A to 2C was fabricated, and the variation of the ID-VG characteristics of the transistor under light irradiation was evaluated. Samples A1 to A3 and Sample B1 described below were fabricated and evaluated in this example. Each of Samples A1 to A3 and Sample B1 has a channel length L of 6 μm and a channel width W of 50 μm.

The samples fabricated in this example are described below. Note that the reference numerals used for the transistor 100 in FIGS. 2A to 2C are used in the following description.

<Fabrication Method of Samples A1 to A3>

First, the conductive film 104 was formed over the substrate 102. As the substrate 102, a glass substrate was used. As the conductive film 104, a 100-nm-thick tungsten film was formed with a sputtering apparatus.

Next, the insulating films 106 and 107 were formed over the substrate 102 and the conductive film 104. As the insulating film 106, a 400-nm-thick silicon nitride film was formed with a PECVD apparatus. As the insulating film 107, a 50-nm-thick silicon oxynitride film was formed with a PECVD apparatus.

Then, the oxide semiconductor film 108 was formed over the insulating film 107. As the oxide semiconductor film 108, an IGZO film was formed with a sputtering apparatus. Note that the oxide semiconductor film 108 was deposited under the conditions where the substrate temperature was 170° C., an argon gas at a flow rate of 100 sccm and an oxygen gas at a flow rate of 100 sccm were introduced into a chamber, the pressure was 0.6 Pa, and an AC power of 2500 W was applied to a polycrystalline metal oxide sputtering target having an atomic ratio of In:Ga:Zn=3:1:2.

Samples A1 to A3 have the oxide semiconductor films 108 with different thicknesses. Specifically, the thicknesses of the oxide semiconductor films 108 of Sample A1, Sample A2, and Sample A3 were 20 nm, 35 nm, and 50 nm, respectively.

Then, first heat treatment was performed by heating at 450° C. under a nitrogen atmosphere for 1 hour and then at 450° C. in a mixed atmosphere of nitrogen and oxygen for 1 hour.

Next, the conductive films 112a and 112b were formed over the insulating film 107 and the oxide semiconductor film 108. As the conductive films 112a and 112b, a 50-nm-thick tungsten film, a 400-nm-thick aluminum film, and a 100-nm-thick titanium film were successively formed in a vacuum with a sputtering apparatus.

After that, the insulating film 114 and the insulating film 116 were formed over the insulating film 107, the oxide semiconductor film 108, and the conductive films 112a and 112b. As the insulating film 114, a 30-nm-thick silicon oxynitride film was formed with a PECVD apparatus. As the insulating film 116, a 400-nm-thick silicon oxynitride film was formed with a PECVD apparatus. Note that the insulating film 114 and the insulating film 116 were formed successively in a vacuum with a PECVD apparatus.

The insulating film 114 was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus. The insulating film 116 was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in a PECVD apparatus.

Then, second heat treatment was performed at 350° C. under a nitrogen atmosphere for 1 hour.

Next, the protective film 117 was formed over the insulating film 116. A 5-nm-thick ITSO film was used as the protective film 117 with a sputtering apparatus. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target ($In_2O_3$:$SnO_2$:$SiO_2$=85:10:5 [wt. %]) provided in a sputtering apparatus.

Next, oxygen addition treatment was performed on the oxide semiconductor film 108 and the insulating films 114 and 116 through the protective film 117. The oxygen addition treatment was performed with an ashing apparatus under the conditions where the substrate temperature was 40° C., an oxygen gas at a flow rate of 250 sccm was introduced into a chamber, the pressure was 15 Pa, and an RF power of 4500 W was supplied for 600 s between parallel-plate electrodes provided in the ashing apparatus so as to apply a bias to the substrate side.

Next, the insulating film 118 was formed over the protective film 117. As the insulating film 118, a 100-nm-thick silicon nitride film was formed with a PECVD apparatus.

Then, third heat treatment was performed at 250° C. under a nitrogen atmosphere for 1 hour.

<Fabrication Method of Sample B1>

A fabrication method of Sample B1 is different from that of Sample A1 described above in the following step. The other steps were the same as the steps for Sample A1.

In the process for Sample B1, formation of the protection film 117 and oxygen addition treatment were not performed after the second heat treatment, and the insulating film 118 was formed over the insulating film 116.

Through the above steps, Samples A1 to A3 and Sample B1 of this example were fabricated.

FIG. 23, FIG. 24, FIG. 25, and FIG. 26 show the ID-VG characteristics of Sample A1, Sample A2, Sample A3, and Sample B1, respectively, under light irradiation. In FIG. 23, FIG. 24, FIG. 25, and FIG. 26, the vertical axis represents ID (A) and the horizontal axis represents VG (V).

The ID-VG characteristics were measured under irradiation with light with an intensity of 50 µW/cm$^2$ and a wavelength ranging from 400 nm to 495 nm, that is, an irradiation energy ranging from 2.5 eV to 3.1 eV. Specifically, the lights with the following wavelengths were irradiated in this order: 495 nm (2.51 eV), 475 nm (2.61 eV), 460 nm (2.70 eV), 455 nm (2.73 eV), 450 nm (2.76 eV), 445 nm (2.79 eV), 440 nm (2.82 eV), 430 nm (2.88 eV), 420 nm (2.95 eV), 415 nm (2.99 eV), and 400 nm (3.10 eV). Therefore, the ID-VG characteristics of each of Samples A1 to A3 and Sample B1 include data measured under 12 conditions (data under the light irradiation at the above 11 wavelengths and data in a dark state). The results of ID-VG characteristics shown in FIG. 23 to FIG. 26 are superimposed data under the 12 conditions.

A voltage (VG, VBG) applied to the conductive films 104 and 120b that respectively function as the first gate electrode and the second gate electrode of the transistor 100 was changed from −15 V to +20 V in increments of 0.25 V. A voltage (VS) applied to the conductive film 112a that functions as the source electrode was 0 V (common), and a voltage (VD) applied to the conductive film 112b that functions as the drain electrode was 10 V.

Figure 27A:
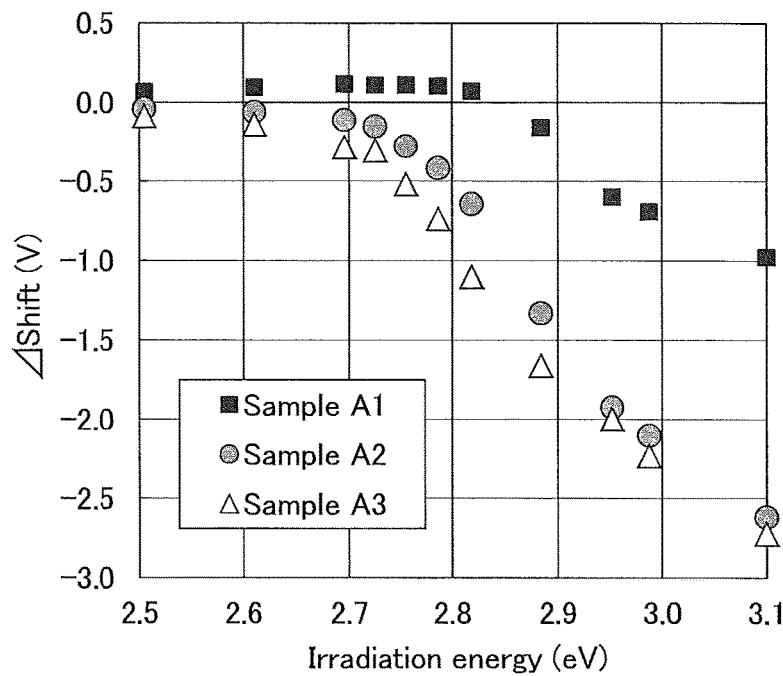
FIGS. 27A and 27B show changes in shift values of transistors due to light irradiation.
Figure 27B:
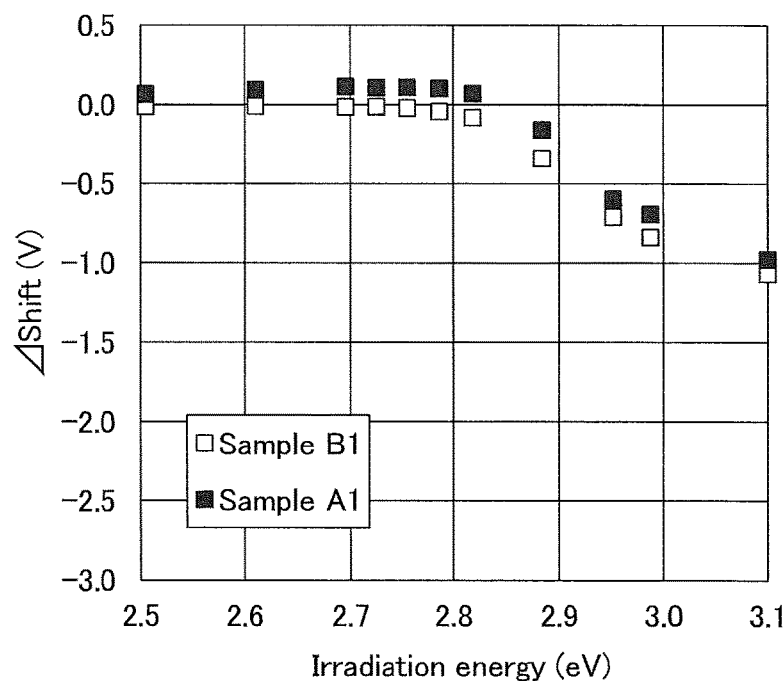

FIG. 27A shows the measurement results of ΔShift of Samples A1 to A3. FIG. 27B shows the measurement results of ΔShift of Sample A1 and Sample B1. In FIGS. 27A and 27B, the vertical axis represents ΔShift (V) and the horizontal axis represents irradiation energy (eV).

According to the results in FIG. 23, FIG. 24, FIG. 25, FIG. 26, and FIGS. 27A and 27B, a change in ΔShift of Sample A1, in which the oxide semiconductor film 108 has a small thickness, was small. In addition, the change in ΔShift of Sample A1 subjected to the oxygen addition treatment is smaller than a change in ΔShift of Sample B1. It was confirmed that Samples A1 to A3 and Sample B1 which were fabricated in this example have high field-effect mobility.

The above-described results indicate that the transistor of one embodiment of the present invention is a semiconductor device which exhibits high field-effect mobility and small variation in characteristics under light irradiation.

The structure described above in this example can be combined with any of the structures described in the other embodiments as appropriate.

This application is based on Japanese Patent Application serial no. 2014-112466 filed with Japan Patent Office on May 30, 2014, the entire contents of which are hereby incorporated by reference.

What is claimed is:

1. A semiconductor device comprising:
   a transistor comprising an oxide semiconductor film comprising a channel region,
   wherein a change from a shift value of the transistor before light irradiation to a shift value of the transistor under light irradiation is greater than or equal to −1 V and less than or equal to 0.5 V, where the shift value is a gate voltage at a point of intersection of an axis of 1×10$^{-12}$ A and a tangent line of the logarithm of a drain current having highest gradient in drain current-gate voltage characteristics of the transistor, and where the light irradiation is performed on the oxide semiconductor film with light having an energy greater than or equal to 2.8 eV and less than or equal to 3.0 eV,
   wherein the oxide semiconductor film comprises In and Ga,
   wherein an atomic ratio of In in the oxide semiconductor film is larger than an atomic ratio of Ga in the oxide semiconductor film,
   wherein an oxide insulating film permeable to oxygen is over the oxide semiconductor film, and
   wherein a thickness of the oxide semiconductor film is greater than or equal to 5 nm and less than or equal to 20 nm so that light absorption by the oxide semiconductor film during light irradiation is suppressed.

2. The semiconductor device according to claim 1, wherein the oxide semiconductor film comprises Zn.

3. The semiconductor device according to claim 1, wherein the oxide semiconductor film comprises a crystal part having c-axis alignment.

4. The semiconductor device according to claim 1, wherein the oxide semiconductor film has a homologous structure.

5. A display device comprising the semiconductor device according to claim 1.

6. A display module comprising:
   the display device according to claim 5; and
   a touch sensor.

7. An electronic appliance comprising:
   the semiconductor device according to claim 1; and
   a battery.

8. A semiconductor device comprising:
   a transistor comprising an oxide semiconductor film comprising a channel region,
   wherein a change from a shift value of the transistor before light irradiation to a shift value of the transistor under light irradiation is greater than or equal to −1 V and less than or equal to 0.5 V, where the shift value is a gate voltage at a point of intersection of an axis of 1×10$^{-12}$ A and a tangent line of the logarithm of a drain current having highest gradient in drain current-gate voltage characteristics of the transistor, and where the light irradiation is performed on the oxide semiconductor film with light having an energy greater than or equal to 2.8 eV and less than or equal to 3.0 eV,
   wherein the oxide semiconductor film comprises In and Ga,
   wherein an atomic ratio of In in the oxide semiconductor film is larger than an atomic ratio of Ga in the oxide semiconductor film,
   wherein a source electrode and a drain electrode are over the oxide semiconductor film,
   wherein an oxide insulating film permeable to oxygen is over the oxide semiconductor film, the source electrode and the drain electrode, and
   wherein a thickness of the oxide semiconductor film is greater than or equal to 5 nm and less than or equal to 20 nm so that light absorption by the oxide semiconductor film during light irradiation is suppressed.

9. The semiconductor device according to claim 8, wherein the oxide semiconductor film comprises Zn.

10. The semiconductor device according to claim 8, wherein the oxide semiconductor film comprises a crystal part having c-axis alignment.

11. The semiconductor device according to claim 8, wherein the oxide semiconductor film has a homologous structure.

12. A display device comprising the semiconductor device according to claim 8.

13. A display module comprising:
the display device according to claim 12; and
a touch sensor.

14. An electronic appliance comprising:
the semiconductor device according to claim 8; and
a battery.

15. A semiconductor device comprising:
a transistor comprising an oxide semiconductor film comprising a channel region,
wherein a change from a shift value of the transistor before light irradiation to a shift value of the transistor under light irradiation is greater than or equal to −1 V and less than or equal to 0.5 V, where the shift value is a gate voltage at a point of intersection of an axis of $1 \times 10^{-12}$ A and a tangent line of the logarithm of a drain current having highest gradient in drain current-gate voltage characteristics of the transistor, and where the light irradiation is performed on the oxide semiconductor film with light having an energy greater than or equal to 2.8 eV and less than or equal to 3.0 eV,
wherein an atomic ratio of In in the oxide semiconductor film is larger than an atomic ratio of Ga in the oxide semiconductor film, and
wherein a thickness of the oxide semiconductor film is greater than or equal to 5 nm and less than or equal to 20 nm so that light absorption by the oxide semiconductor film during light irradiation is suppressed.

* * * * *